United States Patent
Greco et al.

(10) Patent No.: US 9,373,538 B2
(45) Date of Patent: Jun. 21, 2016

(54) INTERCONNECT LEVEL STRUCTURES FOR CONFINING STITCH-INDUCED VIA STRUCTURES

(71) Applicant: International Business Machines Corporation, Armonk, NY (US)

(72) Inventors: Stephen E. Greco, Lagrangeville, NY (US); Rasit O. Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/873,824

(22) Filed: Oct. 2, 2015

(65) Prior Publication Data
US 2016/0027687 A1    Jan. 28, 2016

Related U.S. Application Data

(62) Division of application No. 13/849,796, filed on Mar. 25, 2013.

(51) Int. Cl.
| | |
|---|---|
| *H01L 21/44* | (2006.01) |
| *H01L 21/768* | (2006.01) |
| *H01L 21/311* | (2006.01) |
| *H01L 23/48* | (2006.01) |

(52) U.S. Cl.
CPC .... *H01L 21/76816* (2013.01); *H01L 21/31144* (2013.01); *H01L 21/76802* (2013.01); *H01L 21/76811* (2013.01); *H01L 21/76813* (2013.01); *H01L 21/76877* (2013.01); *H01L 21/76885* (2013.01); *H01L 23/481* (2013.01); *H01L 2924/0002* (2013.01)

(58) Field of Classification Search
CPC ............ H01L 23/481; H01L 23/53238; H01L 23/53295; H01L 23/53223; H01L 2224/05647
See application file for complete search history.

(56) References Cited

U.S. PATENT DOCUMENTS

| | | | |
|---|---|---|---|
| 6,333,258 B1 * | 12/2001 | Miyata | ............. H01L 21/31116 257/E21.038 |
| 6,436,814 B1 | 8/2002 | Horak et al. | |
| 6,664,011 B2 | 12/2003 | Lin et al. | |
| 6,674,168 B1 | 1/2004 | Cooney, III et al. | |
| 7,224,030 B2 | 5/2007 | Schroeder | |
| 7,410,736 B2 | 8/2008 | Bleeker et al. | |
| 7,927,928 B2 | 4/2011 | Pierrat | |
| 8,516,407 B1 | 8/2013 | Wang et al. | |
| 8,631,379 B2 | 1/2014 | Chen et al. | |
| 2002/0076574 A1 | 6/2002 | Cabral, Jr. et al. | |
| 2011/0197168 A1 | 8/2011 | Chen et al. | |

\* cited by examiner

*Primary Examiner* — Zandra Smith
*Assistant Examiner* — John M Parker
(74) *Attorney, Agent, or Firm* — Scully, Scott, Murphy & Presser, P.C.; Steven J. Meyers

(57) ABSTRACT

A design layout is provided such that an underlying conductive line structure underlies a stitch region in an overlying conductive line structure. A stitch-induced via structure can be formed between the underlying conductive line structure and the overlying conductive line structure when a stitch region in a hard mask layer is etched multiple times. At least one of the underlying conductive line structure and the overlying conductive line structure is electrically isolated from other conductive line structures in a same design level so as to avoid unintentional electrical shorts.

10 Claims, 20 Drawing Sheets

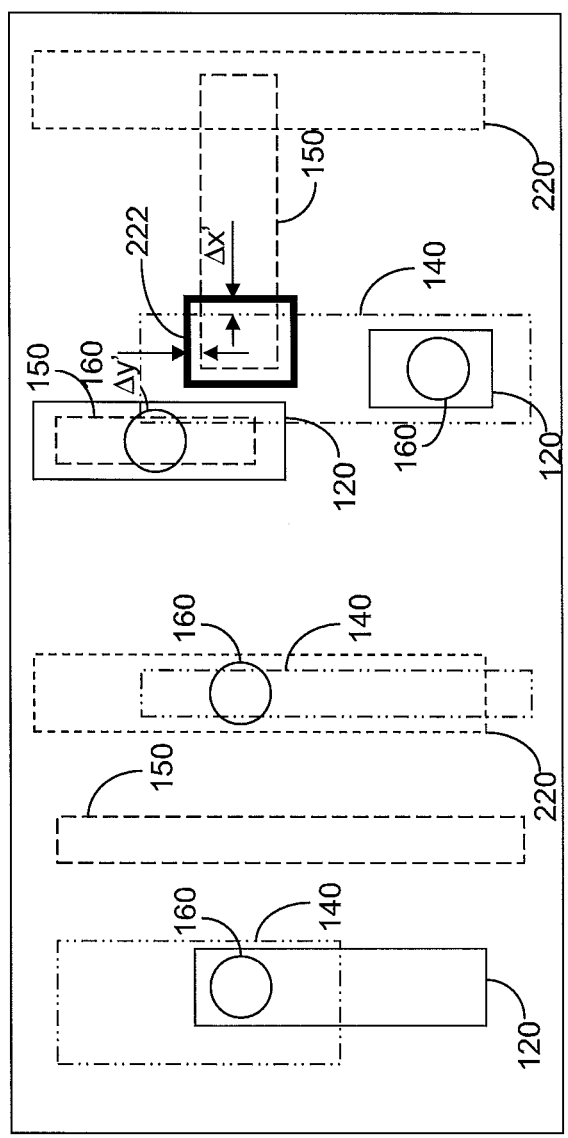

INTERCONNECT LEVEL STRUCTURES FOR CONFINING STITCH-INDUCED VIA STRUCTURES

BACKGROUND

The present disclosure relates generally to a metal interconnect structure including a line level structure for confining stitch-induced via structures above a top surface of a dielectric material layer embedding the line level structure, and a method for forming the same.

Printing a lithographic pattern having pitches below lithographic limits of traditional lithographic techniques, e.g., below 80 nm, does not yield patterns with high fidelity. To overcome this problem, a multi-exposure technique in which multiple lithographic exposures are performed for a single level, can be employed. In order to implement the multi-exposure technique, a given design shape in a design level may be decomposed into multiple decomposed design shapes. The multiple decomposed design shapes are assigned to different lithographic masks that correspond to different "colors" that collectively constitute the design level. The process of decomposing design shapes into groups of decomposed design shapes corresponding to different colors is referred to as "coloring."

A design shape in a design level can thus includes multiple decomposed shapes corresponding to different colors. The number of colors corresponds to the number of lithographic masks to be employed to print the lithographic pattern corresponding to the design shapes in the design level. Each lithographic mask includes decomposed design shapes of the same color. Each lithographic exposure adds the pattern corresponding to the decomposed design shapes of the corresponding color. If performed correctly, the multiple lithographic exposures add the patterns of the decomposed design shapes of all the colors of the design level to generate the pattern of the original design shape in the design level.

To ensure that the multiple lithographic exposures result in replication of the original pattern despite overlay variations and variations in other lithographic parameters, generation of areas of overlap are built into the decomposition process. The process of generation of areas of overlap between design shapes having different colors and derived from decomposition of an original design shape in the given design level is referred to as "stitching." An area of overlap between design shapes having different colors is referred to as a "stitching area" or a "stitch."

Lithographic pattern transfer is implemented by transferring a pattern in a photoresist layer into a material layer by an etch process. Stitches correspond to regions in which multiple etch processes are performed in a same material layer. Thus, a region in a physical structure corresponding to a stitch are prone to be etched through due to multiple etch processes performed therein if sufficient process variations occur in the deposition of the material layer prior to lithographic processes or during the etch processes. If a region corresponding to a stitch is etched through unintentionally, a via structure is collaterally formed during a via etch process when a via structure should not be formed. Formation of such a collateral via structure can create electrical shorts in a metal interconnect structure among components that should be electrically isolated. Further, such a collateral via can be narrow and prevent deposition of a diffusion barrier layer at a thickness sufficient to prevent diffusion of metals (e.g., copper). In that case, metal can diffuse through thin portions of the diffusion barrier layer and diffuse into dielectric materials embedding metal interconnect structures or into semiconductor materials in a semiconductor substrate including semiconductor devices and cause reliability issues. Thus, a method for systematically preventing or minimizing formation of collateral via structures is desired.

SUMMARY

A design layout is provided such that an underlying conductive line structure underlies a stitch region in an overlying conductive line structure. A stitch-induced via structure can be formed between the underlying conductive line structure and the overlying conductive line structure when a stitch region in a hard mask layer is etched multiple times. At least one of the underlying conductive line structure and the overlying conductive line structure is electrically isolated from other conductive line structures in a same design level so as to avoid unintentional electrical shorts.

According to an aspect of the present disclosure, a metal interconnect structure is provided, which includes a stack of dielectric material layers embedding a conductive line structure in a conductive line level, an underlying conductive line structure located in an underlying conductive line level underneath the conductive line level, and a via structure that contacts the conductive line structure and contacts, or overlies without contacting, the underlying conductive line structure. At least one of the conductive line structure and the underlying line structure does not contact any conductive structure other than the via structure.

According to another aspect of the present disclosure, a method of forming a metal interconnect structure is provided. An underlying conductive line structure embedded in a dielectric material layer is formed. A top surface of the underlying conductive line structure is coplanar with a top surface of the dielectric material layer. Another dielectric material layer is formed over the dielectric material layer and the underlying conductive line structure. A patterned hard mask layer is formed over the other dielectric material layer. The patterned hard mask layer includes a first pattern region in which a portion of a top surface of the patterned hard mask layer is recessed relative to a topmost surface of the patterned hard mask layer by a first recess depth, a second pattern region in which another portion of the top surface of the patterned hard mask layer is recessed relative to the topmost surface of the patterned hard mask layer by a second recess depth, and a third pattern region adjoining the first pattern region and the second pattern region that is recessed relative to the topmost surface of the patterned hard mask layer by a third recess depth that is greater than the first recess depth and is greater than the second recess depth. An entirety of an area of the third pattern region is within an area of the underling conductive line structure in a see-through top-down view along a direction perpendicular to the topmost surface of the patterned hard mask layer.

BRIEF DESCRIPTION OF SEVERAL VIEWS OF THE DRAWINGS

FIG. 16 is a plan view of a third exemplary design layout including a design shape in the underlying conductive line level for confining stitch-induced via structures according to a third embodiment of the present disclosure.

DETAILED DESCRIPTION

Figure 1:
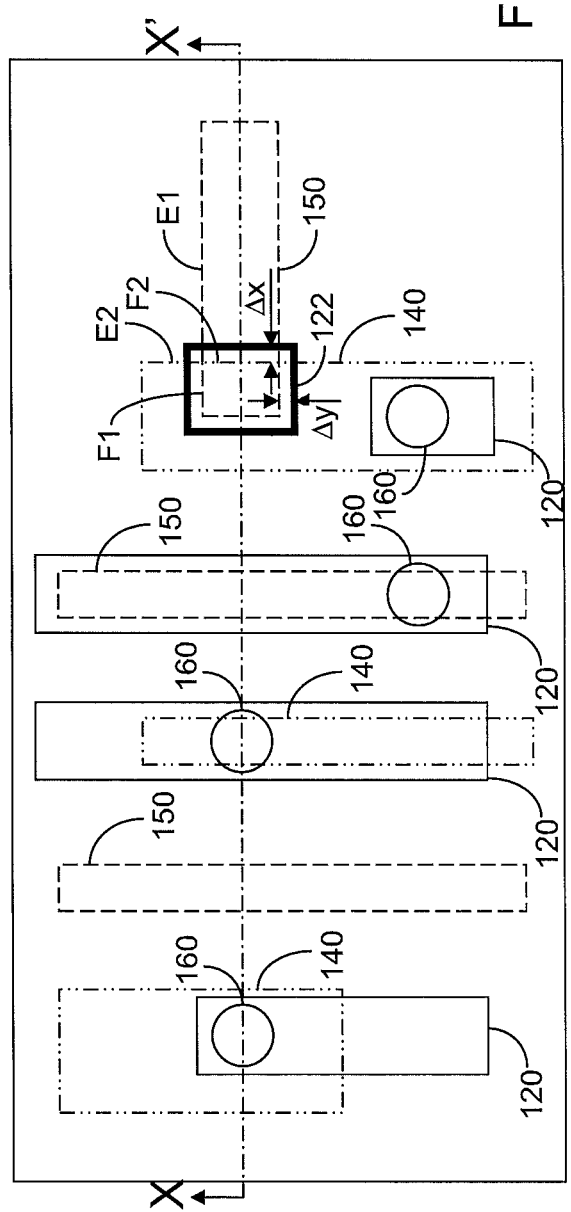
FIG. 1 is a plan view of a first exemplary design layout including a design shape in the underlying conductive line level for confining stitch-induced via structures according to a first embodiment of the present disclosure.

As stated above, the present disclosure relates to a metal interconnect structure including a line level structure for confining stitch-induced via structures above a top surface of a dielectric material layer embedding the line level structure, and a method for forming the same. Aspects of the present disclosure are now described in detail with accompanying figures. It is noted that like and corresponding elements are referred to by like reference numerals. The drawings are not drawn to scale. Ordinals are used merely to distinguish among similar elements, and different ordinals may be employed across the specification and the claims of the instant application.

Referring to FIG. 1, a first exemplary design layout is illustrated, which includes design shapes representing various conductive structures to be formed in a target interconnect structure. As used herein, a "design layout" refers to a collection of data that represents a geometrical relationship between various structural elements of conductive structures embedded in dielectric material layers that can be manufactured on a substrate. As used herein, a "design level" is a level within a design layout that includes geometrical shapes that are related, directly or indirectly, to a same set of processing steps for forming physical objects on a substrate. The geometrical shapes may be represented in a graphics format or in a non-graphics format. As used herein, a "mask level" is identical to a design level if mask decomposition is not employed, or is a subset of a design level corresponding to a same color if mask decomposition is employed in the design level. As used herein, an "interconnect structure" refers to a structure in which a plurality of conductive structures are embedded in at least one dielectric material layer to provide at least one conductive path. As used herein, a "target interconnect structure" is an ideal interconnect structure in which all structural and compositional parameters comply with a design layout therefor and process assumptions employed in a manufacturing process. As used herein, a "metal interconnect structure" refers to an interconnect structure in which metal structures are embedded as conductive structures. As used herein, a "line level structure" refers to a conductive structure that extends in a horizontal direction within a same level, i.e., between two horizontal planes separated by a thickness of the line level structure, of an interconnect structure. As used herein, a "line level" refers to a level including at least one line level structure. As used herein, a "via level structure" refers to a conductive structure that extends in a vertical direction between two different line levels. As used herein, a "via level" refers to a level between two vertically adjacent line levels.

Particularly, the first exemplary design layout includes a design shape in an underlying conductive line level for confining stitch-induced via structures according to a first embodiment of the present disclosure. The design layout includes a conductive line level, at least one underlying conductive line level, and a via design level. The conductive line level includes conductive-line-level design shapes that represent conductive line structures in a conductive line level in a target interconnect structure. The conductive line level is a line level that overlies at least another line level in an interconnect structure. The conductive line level is herein referred to as an M(x+1) level, in which x is an integer that represents the order, from bottom to top, of the conductive line level within the interconnect structure. X can be any non-negative integer. In addition, if a local interconnect level including local interconnect structures as known in the art is employed underneath an M1 level, such a local interconnect level is herein referred to as an M0 level. If two local interconnect levels located at different levels are employed underneath an M1 level, a lower local interconnect level is herein referred to as an M(−1) level and an upper local interconnect level is herein referred to as an M0 level.

The conductive-line-level design shapes include a plurality of decomposed design shapes having different colors that correspond to different lithographic masks. Each set of design shapes of the same color collectively provide a pattern for a lithographic mask. The collection of all sets of design shapes for the conductive-line-level design shapes collectively provide the entirety of the patter for conductive line structures to be formed in the target interconnect structure. For example, the conductive-line-level design shapes can be M(x+1) level design shapes. The M(x+1) level design shapes can include M(x+1) level design shapes having a first color and physically manifested as a first pattern in a first lithographic mask, and M(X+1) level design shapes having a second color and physically manifested as a second pattern in a second lithographic mask. The M(x+1) level design shapes having the first color are herein referred to as first color M(x+1) level design shapes 140, and the M(x+1) level design shapes having the second color are herein referred to as second color M(x+1) level design shapes 150.

While the present disclosure is described employing two colors, variations of the present disclosure employing three or more colors for the conductive line level are expressly contemplated herein.

Each of the at least one underlying conductive line level includes underlying-conductive-line-level design shapes that represent underlying conductive line structure in an underlying conductive line level located underneath the conductive line level in the target interconnect structure. The underlying conductive line level is a single line level that underlies the conductive line level, i.e., the M(x+1) level. In one embodiment, the underlying conductive line level can be an Mx level that is the underlying line level that underlies the M(x+1) level and is most proximate to the M(x+1) level.

The underlying-conductive-line-level design shapes may have the same color (i.e., does not use mask decomposition techniques), or may include a plurality of decomposed design shapes having different colors that correspond to different lithographic masks (i.e., use mask decomposition techniques). The underlying-conductive-line-level design shapes can be Mx level design shapes 120.

The via design level includes via-level design shapes 160 that represent via structures to vertically interconnect the conductive line structures and the underlying conductive line structures.

As used herein, a "stitch shape" is a shape in which a decomposed design shape having a shape and located within the conductive line level intersect with another decomposed design shape having a different color and located within the conductive line level. The stitch shapes are design shapes defined by the areal intersection of conductive-line-level design shapes having different colors, i.e., conductive-line-level design shapes assigned to different mask levels. For example, stitch shapes can include design shapes defined by the areal intersection of the first color M(x+1) level design shapes and second color M(x+1) level design shapes. Each stitch shape can be a polygon. In one embodiment, each stitch shape can be a rectangle.

For one of more of the stitch shapes present in the M(x+1) level, a design shape in the underlying conductive line level, i.e., the Mx level, occupies the entirety of the area of the one or more stitch shapes. For example, a stitch-surrounding design shape 122 can be a type of Mx-level design shapes 120 that occupies the entirety of the area of the a stitch shape. The edges of the stitch-surrounding design shape 122 can be laterally and outwardly shifted relative to the edges of the stitch shape by a set of predetermined edge offset parameters. The set of predetermined edge offset parameters can include an x-axis overlay-based edge offset parameter $\Delta x$ and a y-axis overlay-based edge offset parameter $\Delta y$. The overlay-based edge offset parameters can be derived from the overlay tolerance for a lithographic process for patterning the conductive line structures (i.e., the M(x+1) level conductive structures) relative to underlying conductive line structures in the underlying conductive line structures (i.e., the Mx level conductive structures).

In one embodiment, an underlying conductive line structure that physically manifests the stitch-surrounding design shape 122 in the Mx level in a target interconnect structure is electrically isolated from any other conductive structure except a collateral via structure that is connected to a conductive line structure in the M(x+1) level that physically manifests the design shape in the M(x+1) level that includes the area of the overlapping stitch shape.

As used herein, an "electrically isolated" element refers to an element that does not have any electrical connection with any other conductive structure. As such, a physical structure implementing an electrically isolated design shape is electrically floating, i.e., is not applied with any external voltage and does not serve as a current path. For example, an electrically isolated design shape can be a design shape representing a conductive fill portion employed to increase the pattern factor for conductive areas relative to the entire area of the interconnect structure. An electrically isolated design shape can represent a conductive line level structure that is designed to be electrically isolated from any other conductive line level structure or via level structure.

As used herein, an "electrically connected" element refers to an element that has an electrical connection with at least another conductive structure. As such, a physical structure implementing an electrically connected design shape is not electrically floating, and can be applied with any external voltage and serves as a current path. For example, an electrically connected design shape can be a design shape representing a metal line structure or a metal via structure.

In one embodiment, if the M(x+1) level design shape that includes a stitch shape is an electrically isolated design shape, and the design shape in the Mx level that overlaps the entirety of the stitch-surrounding design shape 122 does not introduce any electrical short to a corresponding physical Mx level line structure in a target interconnect structure because a physical M(x+1) level line structure implementing the M(x+1) level design shape including the stitch shape is electrically isolated.

In one embodiment, if the M(x+1) level design shape that includes a stitch shape is an electrically connected design shape, the design shape in the Mx level that overlaps the entirety of the stitch-surrounding design shape 122 does not introduce any electrical short to a physical M(x+1) level line structure implementing the M(x+1) level design shape including the stitch shape in a target interconnect structure because a physical Mx level line structure corresponding to the design shape in the Mx level is electrically isolated.

At least one of the stitch-surrounding design shape 122 in the Mx level and the M(x+1) level design shape that includes the corresponding stitch is electrically isolated in the design layout. In one embodiment, the stitch-surrounding design shape 122 in the Mx level that overlaps with the stitch shape is electrically isolated in the design layout. In another embodiment, the M(x+1) level design shape that overlaps with a stitch shape is electrically isolated in the design layout. In yet another embodiment, both of the stitch-surrounding design shape 122 in the Mx level and the M(x+1) level design shape including the stitch shape are electrically isolated in the design layout.

Figure 2:
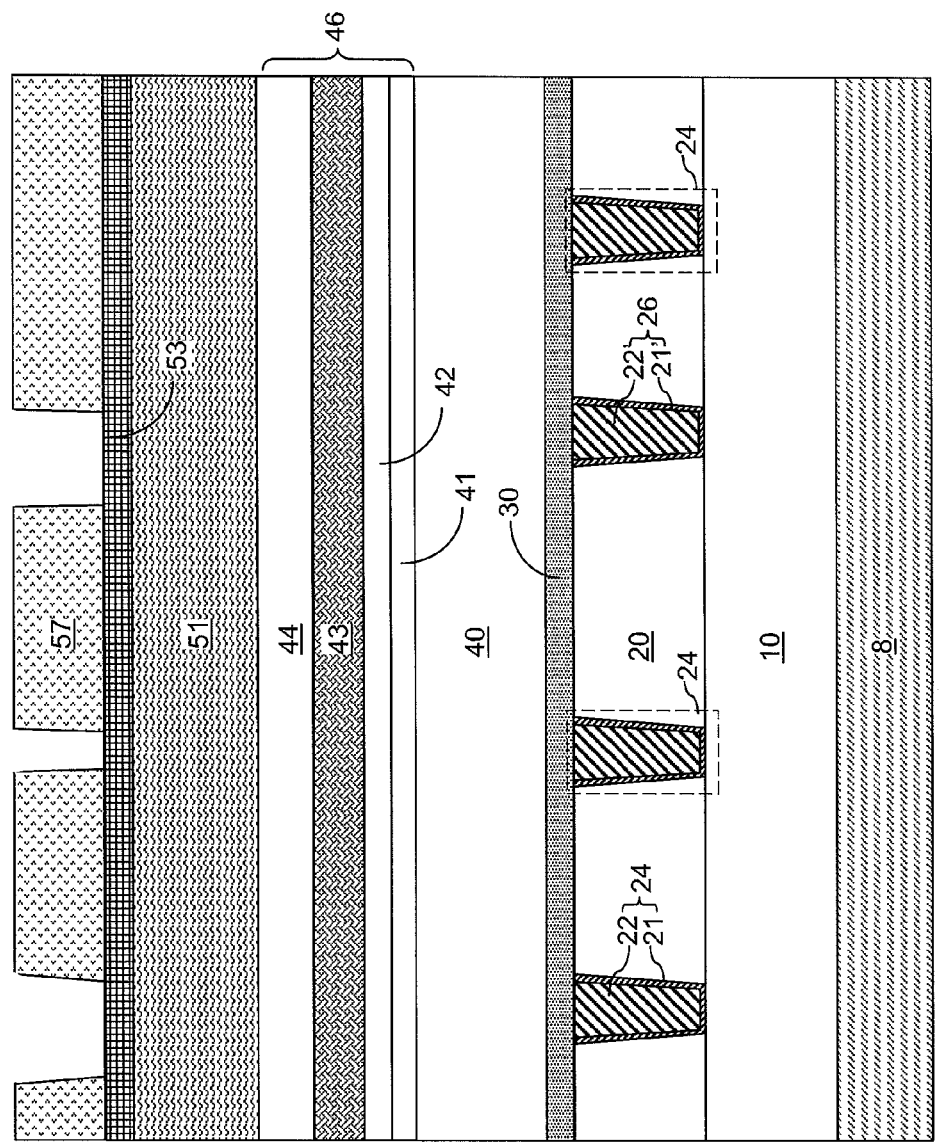
FIG. 2 is a vertical cross-sectional view of a first exemplary metal interconnect structure after formation of underlying conductive line level structures and lithographic patterning of a first photoresist layer with a first line pattern employing a first line level lithographic mask for a conductive line level according to the first embodiment of the present disclosure.

Referring to FIG. 2, a first exemplary metal interconnect structure according to a first embodiment of the present disclosure is shown. The first exemplary metal interconnect structure can be a target interconnect structure for the first design layout shown in FIG. 1. The first exemplary interconnect structure includes a stack, from bottom to top, of a substrate 8, a first dielectric material layer 10, a second dielectric material layer 20, an optional dielectric cap layer 30, a third dielectric material layer 40, and a stack of hard mask layers.

The substrate 8 can include a semiconductor substrate and at least one semiconductor device thereupon or therein. The substrate 8 may additionally include interconnect structures (not shown). Each of the first dielectric material layer 10, the second dielectric material layer 20, and the third dielectric material layer 40 can include a dielectric material such as silicon oxide, silicon nitride, silicon oxynitride, and/or porous or non-porous organosilicate glass (OSG). Each of the first dielectric material layer 10, the second dielectric material layer 20, and the third dielectric material layer 40 can have a thickness in a range from 50 nm to 300 nm, although lesser and greater thicknesses can also be employed.

The optional dielectric cap layer 30, if present, can include a dielectric material that prevents diffusion of metallic impurities therethrough. The optional dielectric cap layer 30 may include a dielectric material such as nitrogen-doped organosilicate glass and/or silicon nitride. The thickness of the optional dielectric cap layer 30, if present, can be from 10 nm to 40 nm, although lesser and greater thicknesses can also be employed. Each of the first dielectric material layer 10 and the third dielectric material layer 40 may include a dielectric material layer that includes a dielectric material that prevents diffusion of metallic impurities therethrough. For example, a bottom portion of the first dielectric material layer 10 and/or a bottom portion of the third dielectric material layer 40 may include a dielectric material that such as nitrogen-doped organosilicate glass and/or silicon nitride.

The first dielectric material layer 10 and the second dielectric material layer 20 may include a hard mask layer (not shown) including a dielectric material that is different from the dielectric material of the underlying portion of the first dielectric material layer 10 or the underlying portion of the second dielectric material layer 20. In this case, the hard mask layer can include, for example, silicon oxide or a non-porous organosilicate glass. The thickness of a hard mask layer can be, for example, from 3 nm to 10 nm, although lesser and greater thicknesses can also be employed. In one embodiment, each of the first dielectric material layer 10 and the second dielectric material layer 20 may include a stack, from bottom to top, of a porous dielectric material layer and a non-porous dielectric material layer.

In one embodiment, the first dielectric material layer 10 can include an M(x−1) level dielectric material layer, the second dielectric material layer 20 can include an Mx level dielectric material layer, and the third dielectric material layer 30 can include an M(x+1) level dielectric material layer. Mx level conductive line structures (24, 26) may be embedded in the second dielectric material layer 20. The Mx level conductive line structures (24, 26) are herein referred to as underlying conductive line level structures. The first dielectric material layer 10 may, or may not, be an interconnect-level dielectric material layer, and may, or may not, include line level conductive structures (not shown).

The Mx level conductive line structures (24, 26) the underlying conductive line level structures are embedded in the second dielectric material layer 20. The top surfaces of the Mx level conductive line structures (24, 26) can be coplanar with the top surface of the second dielectric material layer 20.

The Mx level conductive line structures (24, 26) can include an interconnect conductive line structure 24 that provide electrical connections among electrical components as known in the art, and a via-catching conductive line structure 26. The via-catching conductive line structure 26 corresponds to the design shape in the underlying conductive line level (i.e., the Mx level) of the first embodiment or in the upper underlying conductive line level (i.e., the Mx level) of the second embodiment that occupies an entirety of an area of an overlapping stitch shape in the M(x+1) level in the design layout. The interconnect conductive line structure 24 can include a metallic liner 21 and a metallic portion 22. The via-catching conductive line structure 26 can include another metallic liner 21' and another metallic portion 22'.

The stack of hard mask layers 46 can include at least one dielectric hard mask layer and at least one metallic hard mask layer. In one embodiment, the stack of hard mask layers 46 can include a first hard mask layer 41 including a first dielectric material, a second hard mask layer 42 including a second dielectric material, a third hard mask layer 43 including a metallic material, and a fourth hard mask layer 44 including a third dielectric material. In one embodiment, the first dielectric material layer 41 can include non-porous organosilicate glass, the second dielectric material layer 42 can include silicon oxide, the third hard mask layer 43 can include a metallic nitride and/or a metallic carbide such as TiN, TaN, and WN and/or TiC, TaC, and WC, and the fourth hard mask layer 44 can include silicon oxide. The thickness of the first hard mask layer 41 can be from 3 nm to 10 nm, the thickness of the second hard mask layer 42 can be from 8 nm to 30 nm, the thickness of the third hard mask layer 43 can be from 15 nm to 60 nm, and the thickness of the fourth hard mask layer 44 can be from 20 nm to 80 nm, although lesser and greater thicknesses can also be employed.

A silicon-based polymer layer 51 may be formed over the stack of hard mask layers 46. The silicon-based polymer layer 51 can include a SiO-rich siloxane polymer such as HM8006™ by Honeywell©. The thickness of the silicon-based polymer layer 51 can be from 100 nm to 400 nm, although lesser and greater thicknesses can also be employed.

A first silicon-based antireflective coating (ARC) layer 53 can be applied over the silicon-based polymer layer 51.

A first photoresist layer 57 can be formed over the first silicon-based ARC layer 53 and lithographically patterned with a first line pattern. The first line pattern includes the pattern defined by the first color M(x+1) level design shapes 140 (See FIG. 1) of a design layout. The printing of the first line pattern in the first photoresist layer 57 can be performed by employing a first line level lithographic mask, which is a first lithographic mask for the M(x+1) level (which is a conductive line level).

Figure 3:
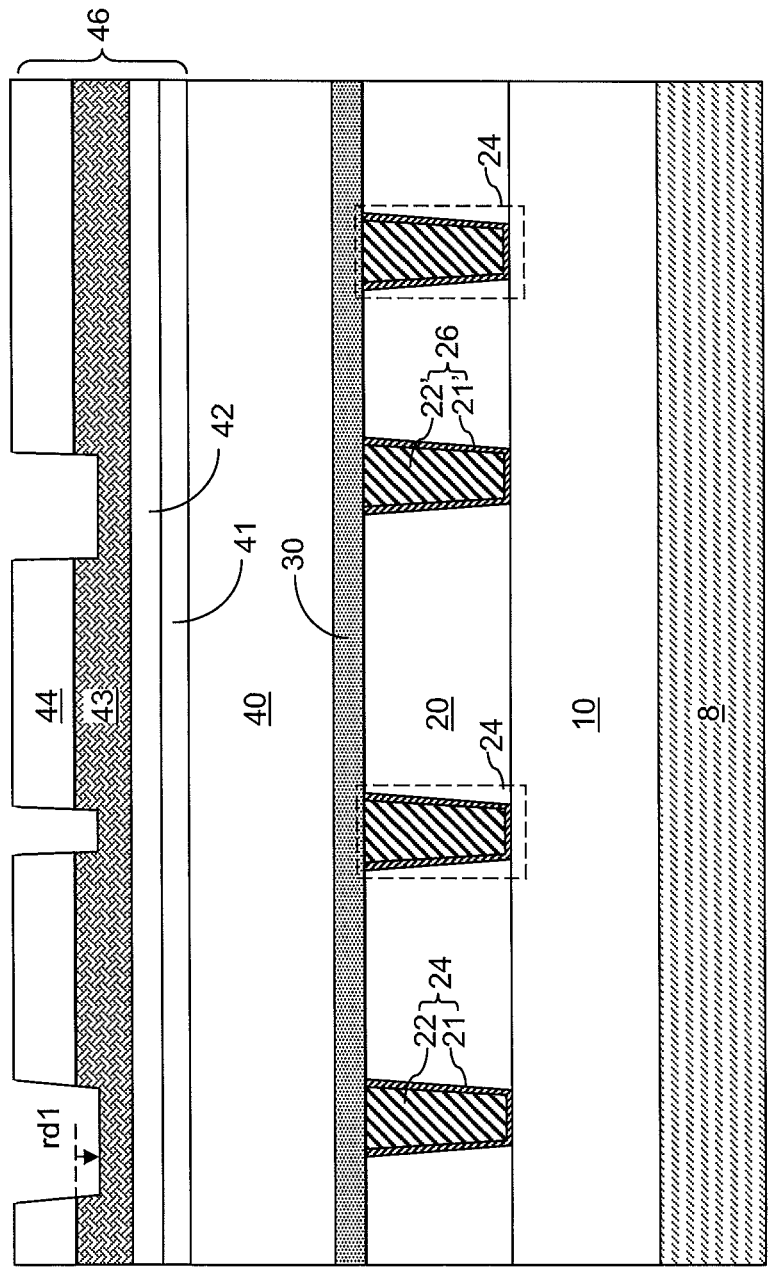
FIG. 3 is a vertical cross-sectional view of the first exemplary metal interconnect structure after transfer of the first line pattern into third and fourth hard mask layers according to the first embodiment of the present disclosure.

Referring to FIG. 3, the first line pattern in the first photoresist layer 57 is transferred through the first silicon-based ARC layer 53 and the silicon-based polymer layer 51 and into an upper portion of the stack of hard mask layers 46 by an anisotropic etch such as a reactive ion etch. In one embodiment, the first line pattern can be transferred through the fourth hard mask layer 44 and into an upper region of the third hard mask layer 43 including a metallic material. The first photoresist layer 57, the first silicon-based ARC layer 53, and the silicon-based polymer layer 51 can be subsequently removed, for example, by ashing. The recessed surfaces of the stack of hard mask layers 46 can be recessed relative to the top surface of the third hard mask layer 43 by a first recess depth rd1. In one embodiment, the first recess depth rd1 can be greater than zero and is less than the thickness of the third hard mask layer 43.

Figure 4:
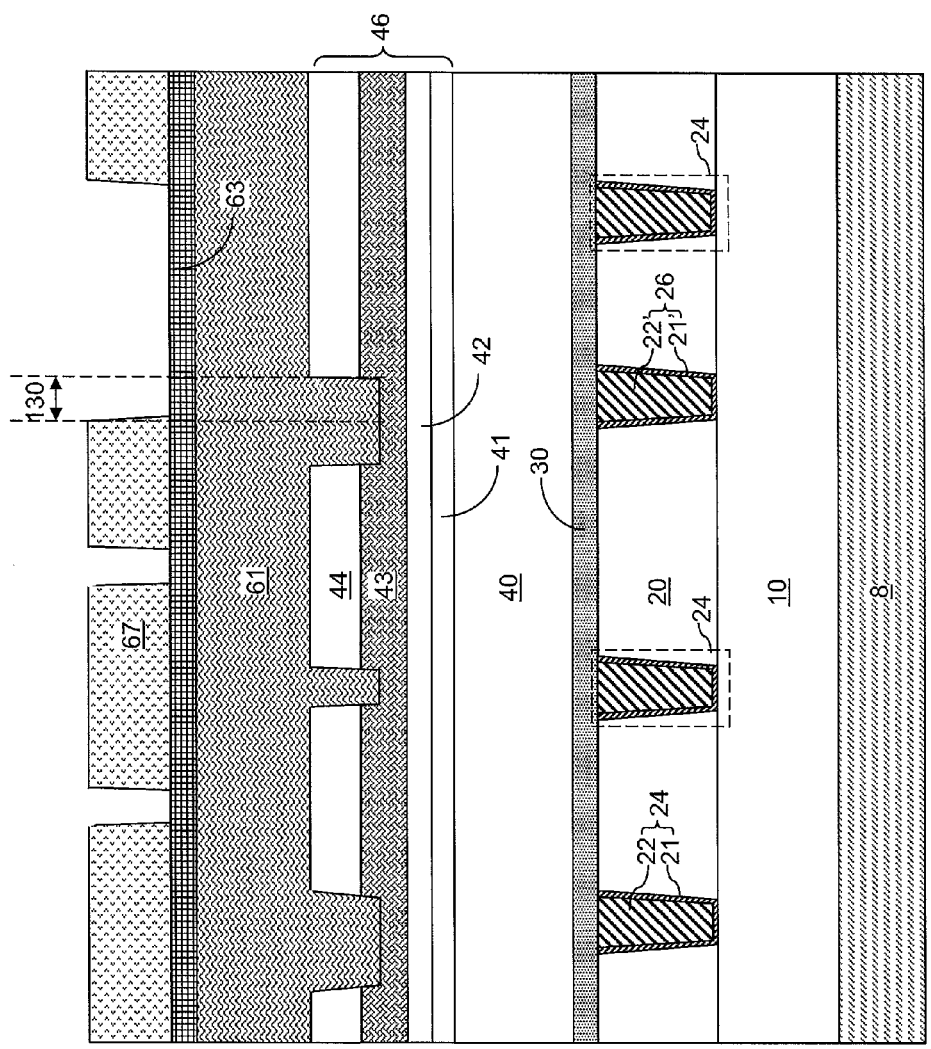
FIG. 4 is a vertical cross-sectional view of the first exemplary metal interconnect structure after lithographic patterning of a second photoresist layer with a second line pattern employing a second line level lithographic mask for the conductive line level according to the first embodiment of the present disclosure.

Referring to FIG. 4, a first organic planarization layer (OPL) 61 is applied to the top surface of the stack of hard mask layers 46, for example, by spin coating. The second OPL 61 includes an organic planarization material known in the art, and can have a thickness in a range from 50 nm to 300 nm, although lesser and greater thicknesses can also be employed. A second silicon-based antireflective coating (ARC) layer 63 can be applied over the first OPL 61.

A second photoresist layer 67 can be formed over the second silicon-based ARC layer 63 and lithographically patterned with a second line pattern. The second line pattern includes the pattern defined by the second color M(x+1) level design shapes 150 (See FIG. 1) of the design layout. The printing of the second line pattern in the second photoresist layer 67 can be performed by employing a second line level lithographic mask, which is a second lithographic mask for the M(x+1) level.

The first line pattern and the second line pattern overlap at each stitch region 130, which is a region on the metal interconnect structure that corresponds to an intersection of a first color M(x+1) level design shape 140 and a second color M(x+1) level design shape 150.

Figure 5:
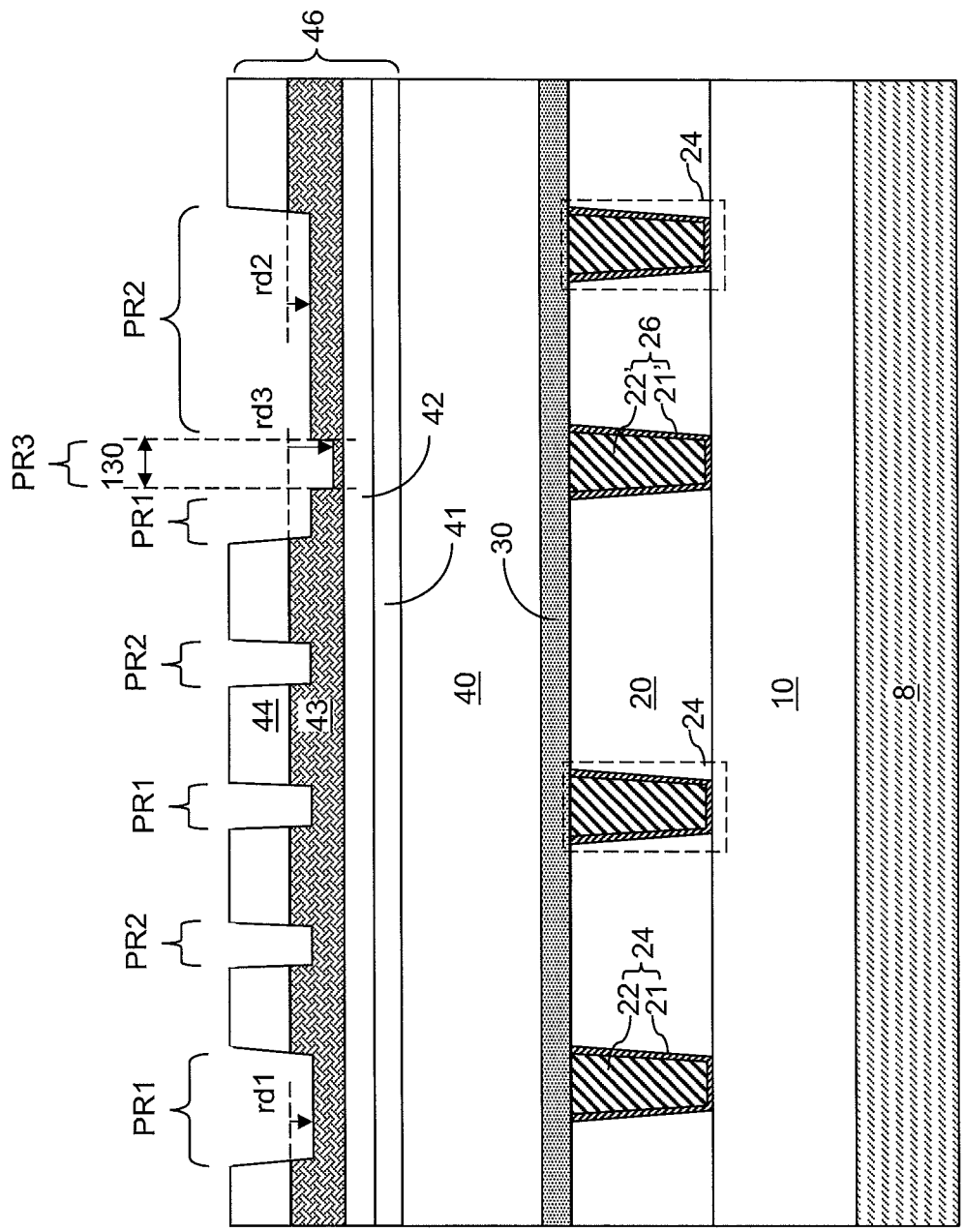
FIG. 5 is a vertical cross-sectional view of the first exemplary metal interconnect structure after transfer of the second line pattern into the third and fourth hard mask layers according to the first embodiment of the present disclosure.

Referring to FIG. 5, the second line pattern in the second photoresist layer 67 is transferred through the second silicon-based ARC layer 63 and the first OPL 61 and into an upper portion of the stack of hard mask layers 46 by an anisotropic etch such as a reactive ion etch. In one embodiment, the second line pattern can be transferred through the fourth hard mask layer 44 and into an upper region of the third hard mask layer 43. Each stitched region 130 is etched further below the first recess depth rd1 during the reactive ion etch that transfers the second line pattern into the upper portion of the stack of hard mask layers 46. The second photoresist layer 67, the second silicon-based ARC layer 63, and the first OPL 61 can be subsequently removed, for example, by ashing.

Each region of the first exemplary metal interconnect structure corresponding to an area of the first color M(x+1) level design shapes 140 that do not overlap the second color M(x+1) level design shapes 150 is herein referred to as a first pattern region PR1. Each region of the first exemplary metal interconnect structure corresponding to an area of the second color M(x+1) level design shapes 150 that do not overlap the first color M(x+1) level design shapes 140 is herein referred to as a second pattern region PR1. Each region of the first exemplary metal interconnect structure corresponding to an area of overlap between the first color M(x+1) level design shapes 140 and the second color M(x+1) level design shapes 150, i.e., the areas of a stitch region 130, is herein referred to as a third pattern region PR3.

The recessed surfaces of the stack of hard mask layers 46 in the first pattern region PR1 can be recessed relative to the top surface of the third hard mask layer 43 by the first recess depth rd1. The recessed surfaces of the stack of hard mask layers 46 in the second pattern region PR2 can be recessed relative to the top surface of the third hard mask layer 43 by a second recess depth rd2. The second recess depth rd2 may be the same as, or may be different from, the first recess depth rd1. In one embodiment, the second recess depth rd2 is greater than zero and is less than the thickness of the third hard mask layer 43. The recessed surfaces of the stack of hard mask layers 46 in the third pattern region PR3 can be recessed relative to the top surface of the third hard mask layer 43 by a third recess depth rd3. The third recess depth rd3 is greater than the first recess depth rd1, and is greater than the second recess depth rd2. In one embodiment, the third recess depth rd3 can be not greater than the thickness of the third hard mask layer 43. In one embodiment, the third recess depth rd3 can be the same as the thickness of the third hard mask layer 43.

The stack of hard mask layers 46 includes the third hard mask layer 43 as a patterned hard mask layer. The patterned hard mask layer, as embodied in the third hard mask layer 43, includes a first pattern region PR1 in which a portion of a top surface of the patterned hard mask layer is recessed relative to a topmost surface of the patterned hard mask layer by a first recess depth rd1, a second pattern region PR2 in which another portion of the top surface of the patterned hard mask layer is recessed relative to the topmost surface of the patterned hard mask layer by a second recess depth rd2, and a third pattern region PR3 adjoining the first pattern region and the second pattern region that is recessed relative to the topmost surface of the patterned hard mask layer by a third recess depth rd3 that is greater than the first recess depth rd1 and is greater than the second recess depth rd2. The entirety of the area of the third pattern region PR3 is within an area of the underling conductive line structure, i.e., a via-catching conductive line structure 26, in a see-through top-down view along a direction perpendicular to the topmost surface of the patterned hard mask layer, i.e., the third hard mask layer 43, according to the design layout illustrated in FIG. 1. The third hard mask layer 43 includes a composite pattern that is a combination of the first line pattern and the second line pattern.

Figure 6:
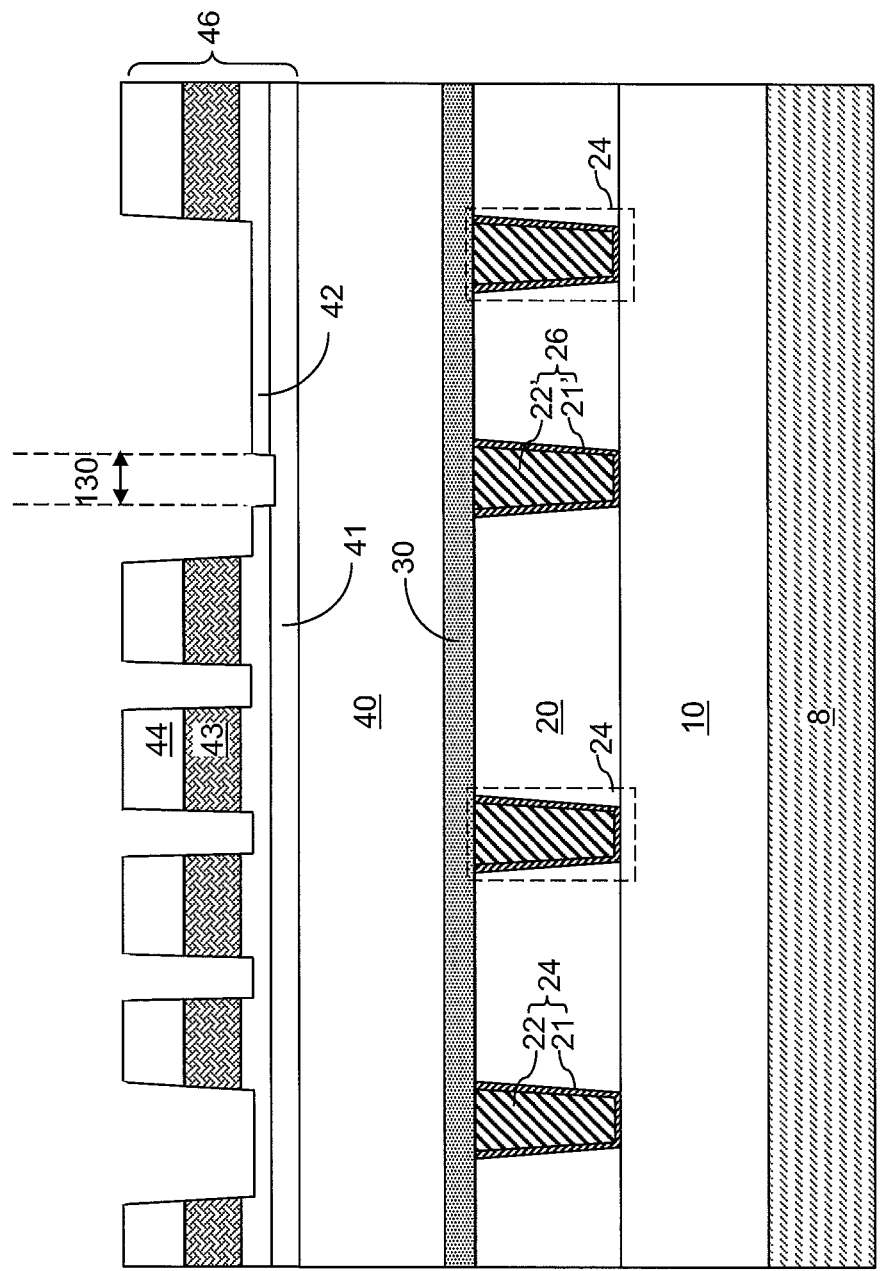
FIG. 6 is a vertical cross-sectional view of the first exemplary metal interconnect structure after transfer of the combination of the first line pattern and the second line pattern into a second hard mask layer according to the first embodiment of the present disclosure.

Referring FIG. 6, the combination of the first line pattern and the second line pattern is transferred into a second hard mask layer 42 by another anisotropic etch. At this step, the stack of hard mask layers 46 includes the second hard mask layer 42 as a patterned hard mask layer. The patterned hard mask layer, as embodied in the second hard mask layer 42, includes a first pattern region PR1 in which a portion of a top surface of the patterned hard mask layer is recessed relative to a topmost surface of the patterned hard mask layer by a recess depth, a second pattern region PR2 in which another portion of the top surface of the patterned hard mask layer is recessed relative to the topmost surface of the patterned hard mask layer by another recess depth, and a third pattern region PR3 adjoining the first pattern region and the second pattern region that is recessed relative to the topmost surface of the patterned hard mask layer by yet another recess depth that is greater than the recess depth of the first pattern region PR1 and is greater than the another recess depth of the second pattern region PR2. The entirety of the area of the third pattern region PR3 is within an area of the underling conductive line structure, i.e., a via-catching conductive line structure 26, in a see-through top-down view along a direction perpendicular to the topmost surface of the patterned hard mask layer, i.e., the third hard mask layer 43, according to the design layout illustrated in FIG. 1. The second hard mask layer 43 includes a composite pattern that is a combination of the first line pattern and the second line pattern.

Figure 7:
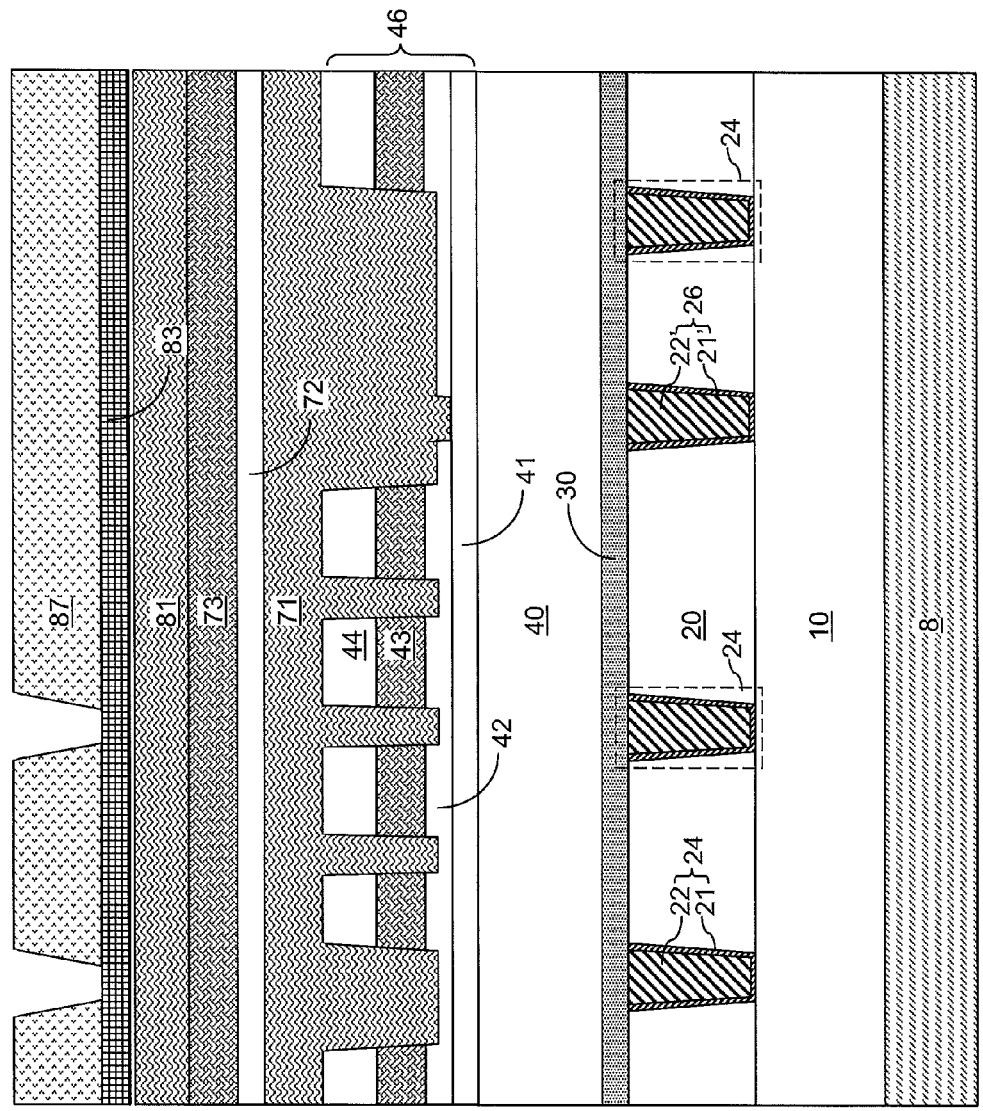
FIG. 7 is a vertical cross-sectional view of the first exemplary metal interconnect structure after lithographic patterning of a third photoresist layer with a via pattern employing a via level lithographic mask for a via level according to the first embodiment of the present disclosure.

Referring to FIG. 7, a second organic planarization layer (OPL) 71 is applied over the stack of hard mask layers 46, for example, by spin coating. The second OPL 71 includes an organic planarization material known in the art, and can have a thickness in a range from 50 nm to 300 nm, although lesser and greater thicknesses can also be employed. At least one via level hard mask layer can be formed over the second OPL. The at least one via level hard mask layer can include, for example, a first via level hard mask layer 72 that includes a dielectric material such as silicon oxide and a second via level hard mask layer 73 that includes a metallic material such as TiN, TaN, WN, TiC, TaC, and/or WC. The thickness of the first via level hard mask layer 72 can be from 15 nm to 60 nm, and the thickness of the second via level hard mask layer 73 can be from 10 nm to 60 nm, although lesser and greater thicknesses can be employed for each of the first and second via level hard mask layers (72, 73).

A third organic planarization layer (OPL) 81 is applied over the stack of the first and second via level hard mask layers (72, 73), for example, by spin coating. The third OPL 81 includes an organic planarization material known in the art, and can have a thickness in a range from 50 nm to 300 nm, although lesser and greater thicknesses can also be employed. A third silicon-based antireflective coating (ARC) layer 83 can be applied over the third OPL 81.

A third photoresist layer 87 can be formed over the third silicon-based ARC layer 83 and lithographically patterned with a via pattern. The second line pattern includes the pattern defined by the via-level design shapes 160 (See FIG. 1) of the design layout. The printing of the via pattern in the third photoresist layer 87 can be performed by employing a via level lithographic mask.

The via pattern overlaps the union of the first line pattern and the second line pattern. In other words, the openings in the third photoresist layer 87 after lithographic patterning overlies the recessed regions (that include the first pattern region PR1, the second pattern region PR2, and the third pattern region PR3; See FIG. 5) within the stack of the hard mask layers 46.

Figure 8:
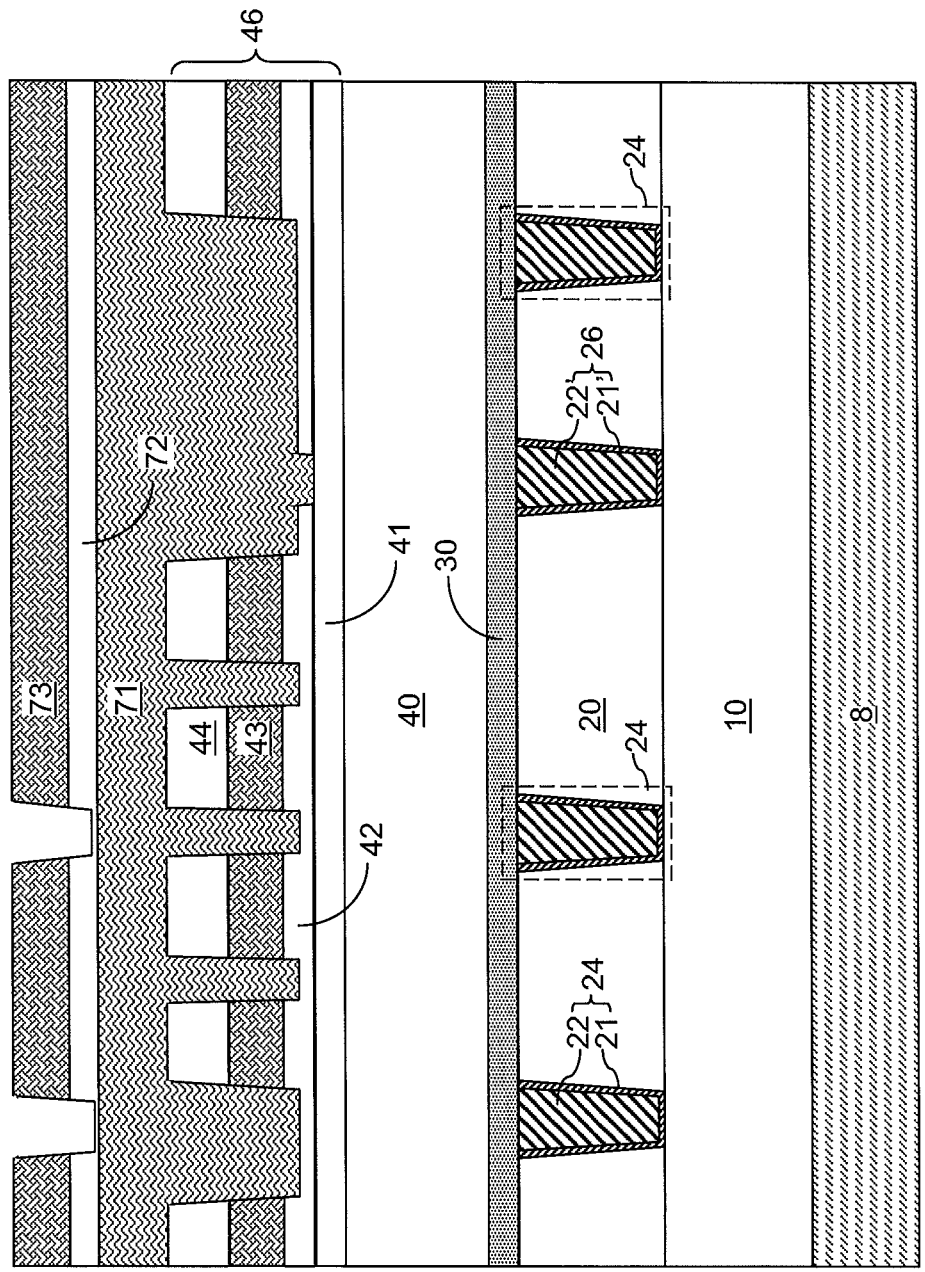
FIG. 8 is a vertical cross-sectional view of the first exemplary metal interconnect structure after transfer of the via pattern into via level hard mask layers according to the first embodiment of the present disclosure.

Referring to FIG. 8, the via pattern in the third photoresist layer 67 is transferred through the third silicon-based ARC layer 83, the third OPL 81, and the second via level hard mask layer 72, and into the first via level hard mask layer 71 by an anisotropic etch such as a reactive ion etch. The third photoresist layer 87, the third silicon-based ARC layer 83, and the third OPL 81 can be subsequently removed, for example, by ashing.

The second via level hard mask layer 73 and an upper portion of the first via level hard mask layer 72 are patterned with the via pattern. The stack of the first and second via level hard mask layers (72, 73) are recessed in regions corresponding to the areas of the via level design shape (See FIG. 1).

Figure 9:
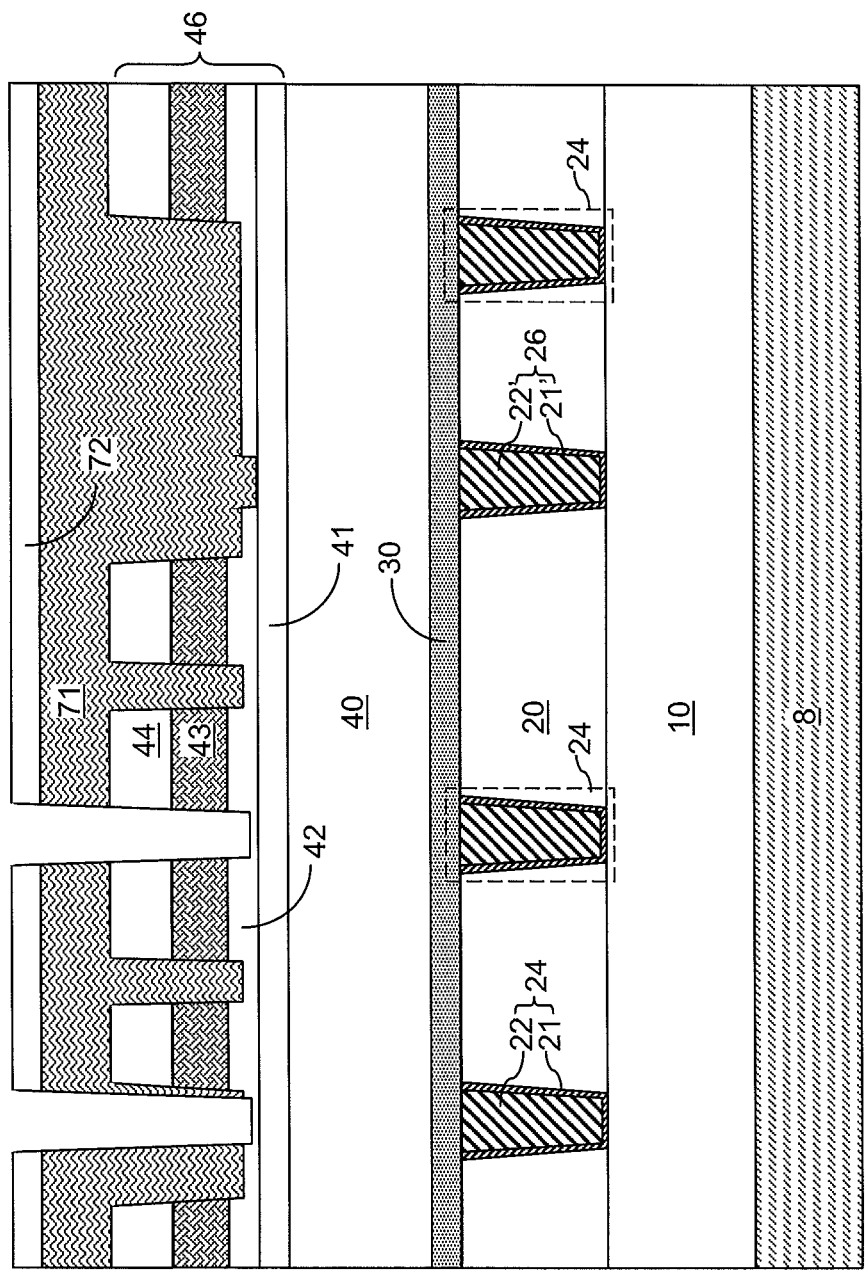
FIG. 9 is a vertical cross-sectional view of the first exemplary metal interconnect structure after transfer of the via pattern into the second hard mask layer according to the first embodiment of the present disclosure.

Referring FIG. 9, the via pattern is transferred through the first via level hard mask layer 72 and the second OPL 71 and into a second hard mask layer 42 by an anisotropic etch that employs the second via level hard mask layer 73 as an etch mask. The anisotropic etch can be a reactive ion etch. At this step, the second hard mask layer 42 is a patterned hard mask layer that includes a combination of the first line pattern, the second line pattern, and the via pattern. The regions including the via pattern are recessed further relative to the surfaces of the second hard mask layer 42 as shown in FIG. 6.

Figure 10:
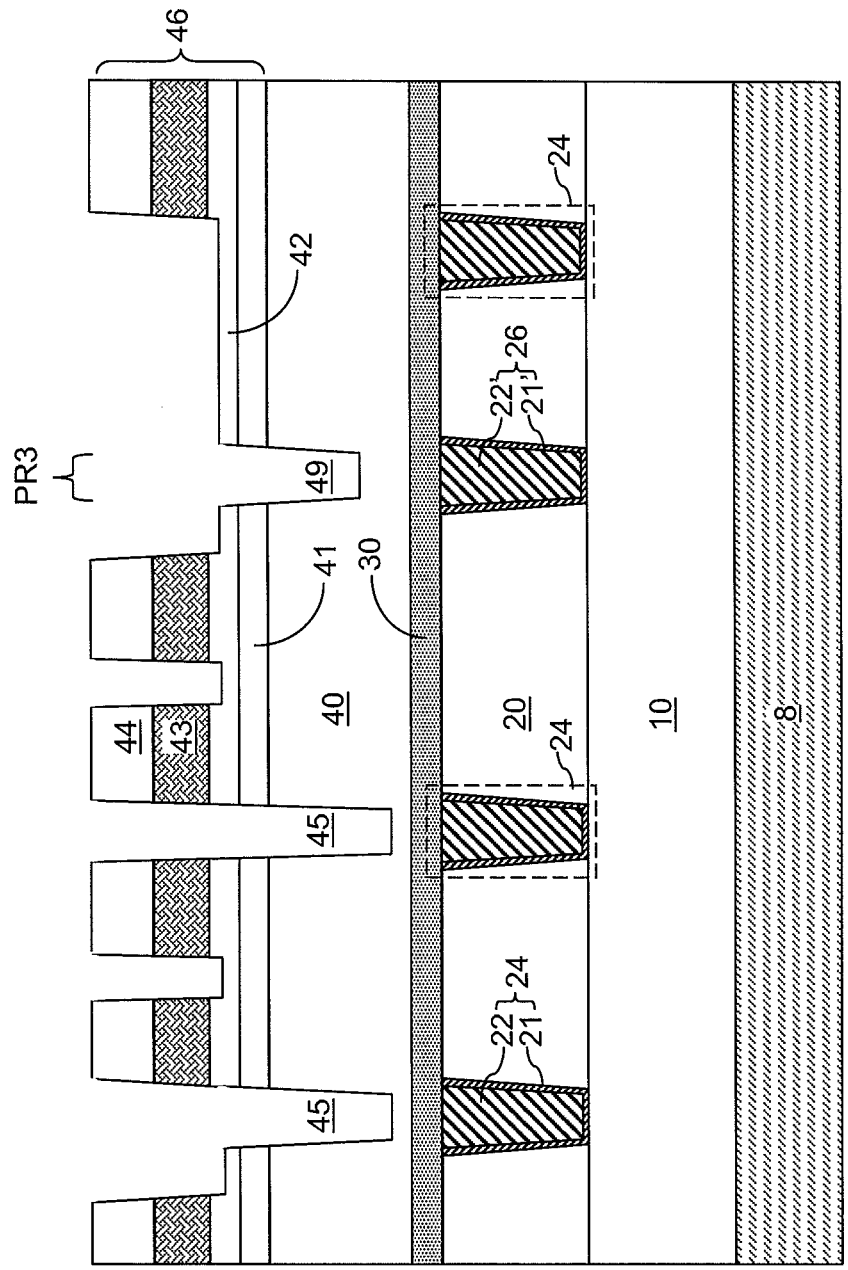
FIG. 10 is a vertical cross-sectional view of the first exemplary metal interconnect structure after transfer of the via pattern into an interconnect level dielectric layer according to the first embodiment of the present disclosure.

Referring to FIG. 10, the via pattern is further transferred through the first and second hard mask layers (41, 42) and into the third dielectric material layer 40 by another anisotropic etch, which can be a continuation of the anisotropic etch employed at the processing step of FIG. 9 or can be a different anisotropic etch employing an etch chemistry different from the anisotropic etch employed at the processing step of FIG. 9. The first via level hard mask layer 72 and the second OPL 71 can be completely consumed during the anisotropic etch. During the removal of the materials of the first via level hard mask layer 72 and the second OPL 71, an interconnect via cavity 45 is formed in each region corresponding to the areas of the via pattern by removal of the materials of the first hard mask layer 41 and the third dielectric material layer 40. Each interconnect via cavity 45 is a via cavity that is formed in a region in which a via structure for providing an electrically conductive path is subsequently formed according to the design layout. As such, the area of each interconnect via cavity 45 corresponds to a via level design shape 160 in the design layout. The second hard mask layer 42 prevents removal of the materials of the first hard mask layer 41 and the third dielectric material layer 40 from regions that laterally surround the interconnect via cavities 45.

Further, the first and second hard mask layers (41, 42) are etched through in each third pattern region PR3 while the interconnect via cavities 45 are etched downward, i.e., while the bottom surfaces of the interconnect via cavities 45 are recessed below the top surface of the first hard mask layer 41. Within each third pattern region PR3, the dielectric materials of the first hard mask layer 41 and the third dielectric material layer 40 are removed by the anisotropic etch to form a collateral via cavity 49. The area of each collateral via cavity 49 does not correspond to any via level design shape 160 in the design layout, but corresponds to a stitch region.

Figure 11:
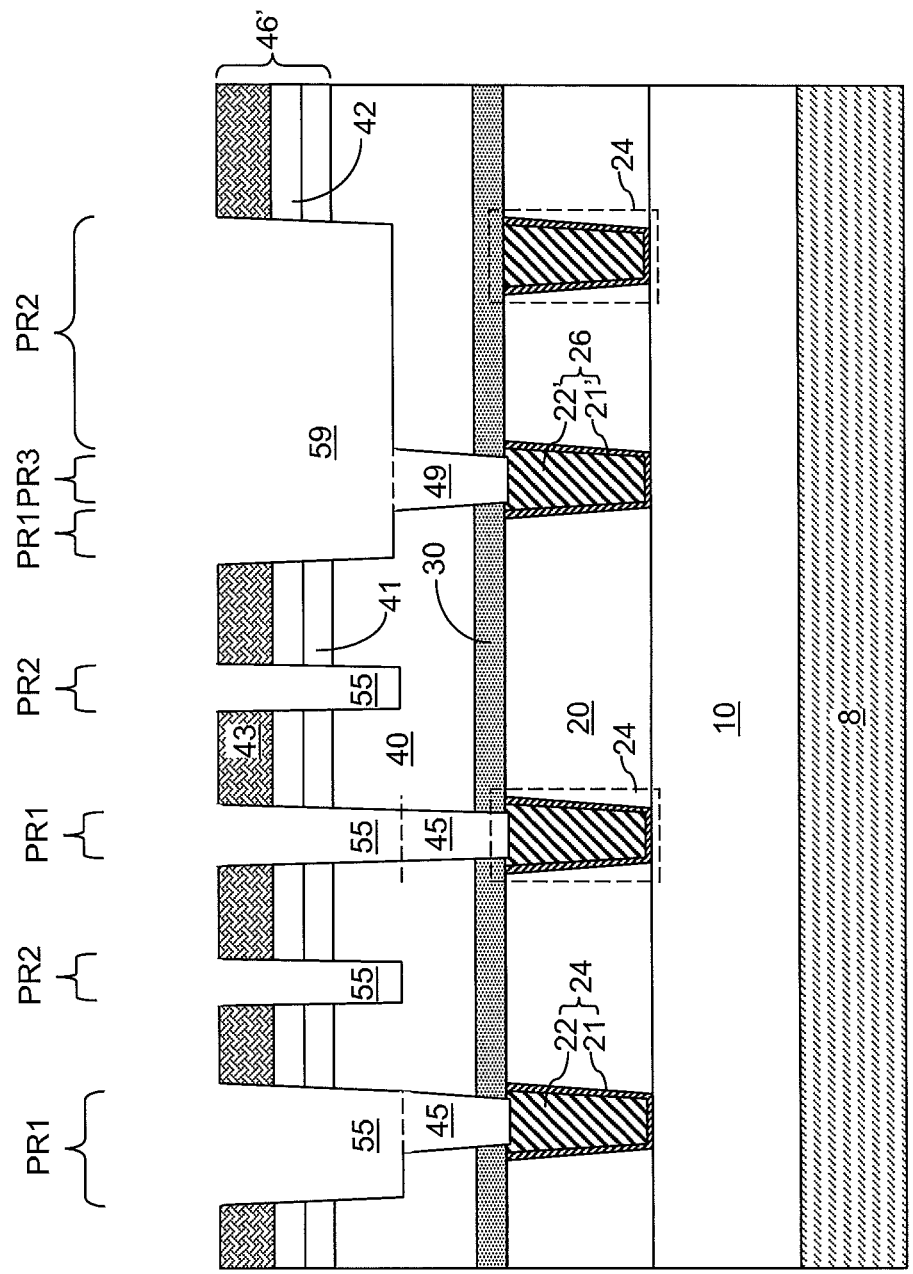
FIG. 11 is a vertical cross-sectional view of the first exemplary metal interconnect structure after transfer of the via pattern through the interconnect level dielectric layer and transfer of the combination of the first and second line patterns into an upper portion of the interconnect level dielectric layer according to the first embodiment of the present disclosure.

Referring to FIG. 11, an anisotropic etch is performed to further etch the dielectric material(s) of the third dielectric material layer 40 employing the fourth hard mask layer 44 as an etch mask. Each interconnect via cavity 45 and each collateral via cavity 49 are vertically extended through the third dielectric material layer 40 and the optional dielectric cap layer 30. In one embodiment, a top surface of an interconnect conductive line structure 24 can be physically exposed at the bottom of each interconnect via cavity 45, and a top surface of a via-catching conductive line structure 26 can be physically exposed at the bottom of each collateral via cavity 49. The lateral extent of the bottom surface of each collateral via cavity 49 is confined within the lateral extent of the top surface of the via-catching conductive line structure 26 that is located directly underneath the collateral via cavity 49. Thus, the via-catching conductive line structure 26 "catches" the overlying collateral via cavity 49 within the area of the top surface of the via-catching conductive line structure 26.

Further, the composite pattern of the combination of the first line pattern and the second line pattern in the third hard mask layer 43 is transferred through the first and second hard mask layers (41, 42) and into an upper portion of the third dielectric material layer 40 to form interconnect line trenches 55 and stitch-region-including line trenches 59. The interconnect line trenches 55 are formed in regions that correspond to the areas of the first-type M(x+1) level design shapes 140 and the second-type M(x+1) level design shapes 150 that do not include any stitch. The stitch-region-including line trenches 59 are formed in regions that correspond to the areas of the first-type M(x+1) level design shapes 140 that include stitches and the areas of the second-type M(x+1) level design shapes 150 that include stitches. The interconnect line trenches 55 and the stitch-region-including line trenches 59 are herein collectively referred to as line trenches (55, 59).

The line trenches (55, 59) are formed in the first, second, and third pattern regions (PR1, PR2, PR3) in the upper portion of the third dielectric material layer 40. Consequently, a bottommost surface of each line trench (55, 59) is located above the top surface of the second dielectric material layer 20. Each collateral via cavity 49 is formed in the third pattern region PR3 in the lower portion of the third dielectric material layer 40. Each collateral via cavity 49 extends to a top surface of an underlying conductive line structure, i.e., a via-catching conductive line structure 26. The collateral via cavities 49 and the interconnect via cavities 45 are herein collectively referred to as via cavities (45, 49).

Figure 12:
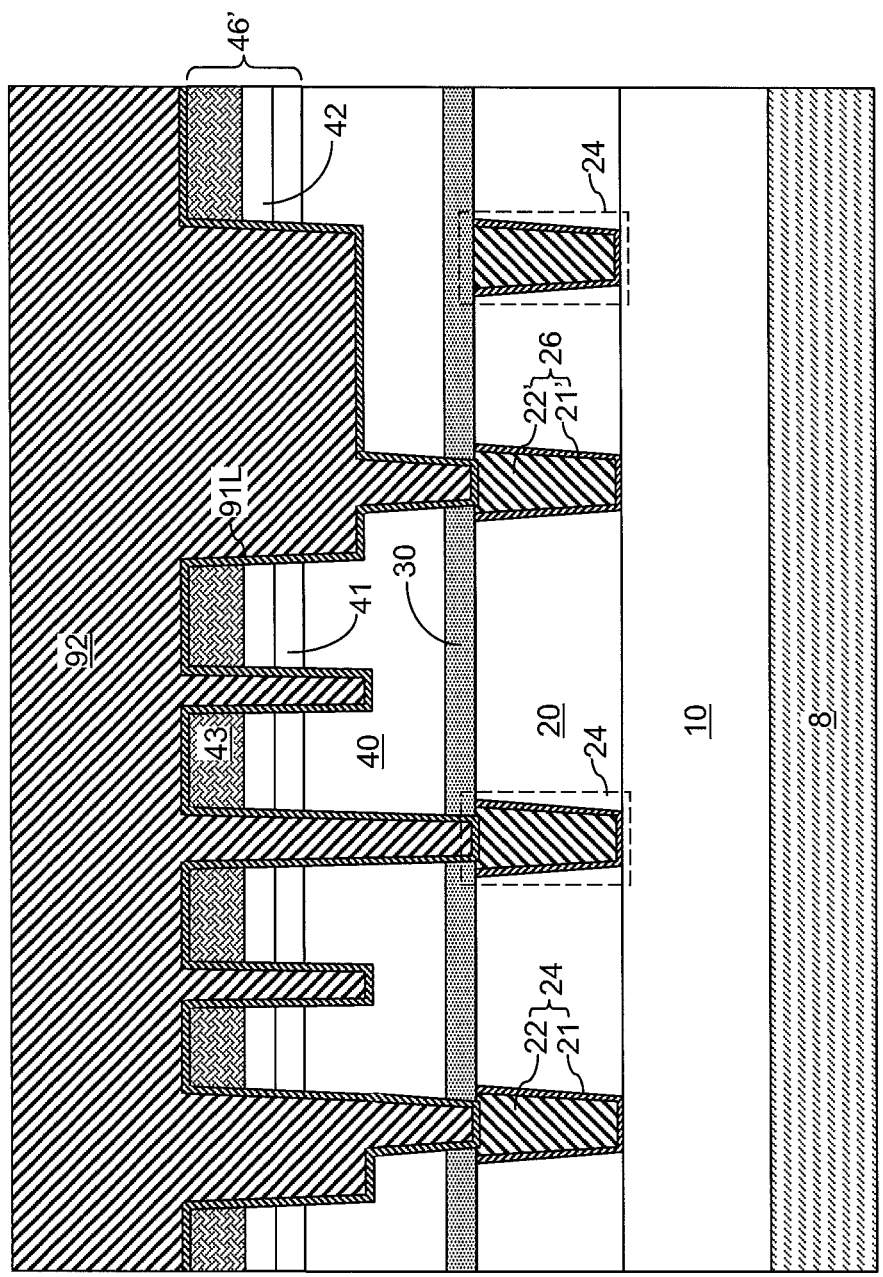
FIG. 12 is a vertical cross-sectional view of the first exemplary metal interconnect structure after depositing at least one metal in the via cavities and line cavities according to the first embodiment of the present disclosure.

Referring to FIG. 12, a metallic liner layer 91L is deposited in the via cavities (45, 49) and the line trenches (55, 59), for example, by physical vapor deposition and/or chemical vapor deposition. The metallic liner layer 91L can include a material such as TiN, TaN, WN, and combinations thereof.

A metal layer 92 is subsequently deposited to fill the via cavities (45, 49) and the line trenches (55, 59), for example, by electroplating, electroless plating, chemical vapor deposition, physical vapor deposition, and/or vacuum evaporation. The metal layer 92 includes at least one metallic material such as copper, aluminum, tungsten, or combinations thereof.

Figure 13:
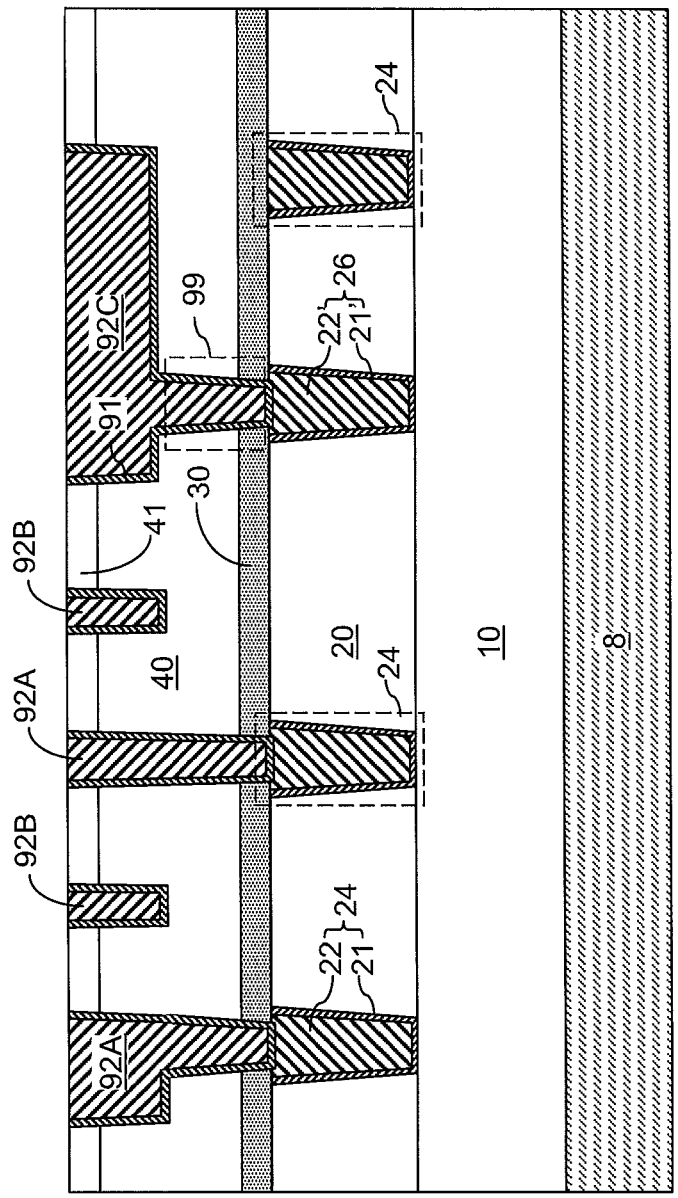
FIG. 13 is a vertical cross-sectional view of the first exemplary metal interconnect structure after formation of via structures and line structures in the interconnect level dielectric layer according to the first embodiment of the present disclosure.

Referring to FIG. 13, the metal layer 92, the metallic liner layer 91L, the third hard mask layer 43, and the second hard mask layer 42 can be planarized, for example, employing a chemical mechanical planarization (CMP) process. The first hard mask layer 41 can be employed as a stopping layer for the CMP process. Various via structures and line structures embedded in the third dielectric material layer 40 and the first hard mask layer 41 are formed.

The various via structures and line structures include integrated conductive line and via structures (92A, 92C), which are contiguous conductive structures filling a line trench (55, 59) and at least one via cavity (45, 49). Each integrated conductive line and via structure (92A, 92B) includes a conductive line structure and at least one via structure.

The integrated conductive line and via structures (92A, 92C) can include an interconnect integrated conductive line and via structure 92A that provides electrical connections among components across the M(x+1) level and the Mx level as known in the art. Each via structure portion of an interconnect integrated conductive line and via structure 92A corresponds a to via level design shape 160 in a design layout. The via structure of the interconnect integrated conductive line and via structure 92A vertically interconnects the conductive line structure of the interconnect integrated conductive line and via structure 92A and an underlying conductive line structure, which is an interconnect conductive line structure 24 embedded in the Mx level.

M(x+1) level conductive line structures 92B are conductive structures filling a line trench (55, 59). The M(x+1) level conductive line structures 92B are line level structures that do not extend below the M(x+1) line level, i.e., does not have any via structure attached thereupon. A metallic liner 91 may be included in each of the M(x+1) level conductive line structure 92B and integrated conductive line and via structures (92A, 92C).

The integrated conductive line and via structures (92A, 92C) can further include a stitch-including integrated conductive line and via structure 92C, which corresponds to an M(x+1) level design shape including a stitch in the design layout. The via structure that is a portion of the stitch-including integrated conductive line and via structure 92C is a collateral via structure 99, which does not have a corresponding via level design shape in the design layout, but is formed due to the stitch present in an M(x+1) level design shape that defines the line structure portion of the stitch-including integrated conductive line and via structure 92C. The via structure of the stitch-including integrated conductive line and via structure 92C vertically interconnects the conductive line structure of the stitch-including integrated conductive line and via structure 92C and an underlying conductive line structure, which is a via-catching conductive line structure 26 embedded in the Mx level of the first exemplary metal interconnect structure and corresponding to a stitch-surrounding design shape 122 in the Mx level of the design layout.

In one embodiment, at least one of the conductive line structure within the stitch-including integrated conductive line and via structure 92C and the via-catching conductive line structure 26 (which is an underlying line structure) does not contact any conductive structure other than the collateral via structure 99. In one embodiment, the conductive line structure within the stitch-including integrated conductive line and via structure 92C does not contact any conductive structure other than the collateral via structure 99. In another embodiment, the via-catching conductive line structure 26 (i.e., the underlying conductive line structure in the Mx level) does not contact any conductive structure other than the collateral via structure 99. In yet another embodiment, both of the conductive line structure within the stitch-including integrated conductive line and via structure 92C and the via-catching conductive line structure 26 do not contact any conductive structure other than the collateral via structure 99.

The first metal interconnect structure includes a stack of dielectric material layers (20, 30, 40, 41) embedding a conductive line structure (e.g., the conductive line structure within the stitch-including integrated conductive line and via structure 92C) in a conductive line level (e.g., the M(x+1) level, an underlying conductive line structure (e.g., a via-catching conductive line structure 26) located in an underlying conductive line level (i.e., the Mx level corresponding to the level of the second dielectric material layer 20) underneath the conductive line level (i.e., the M(x+1) level corresponding to the level of the third dielectric material layer 40 and the first hard mask layer 41 if any portion remains at this step), and a via structure (i.e., a collateral via structure 99) that vertically interconnect the conductive line structure and the underlying conductive line structure. At least one of the conductive line structure and the underlying line structure does not contact any conductive structure other than the collateral via structure 99.

In one embodiment, a top surface of the conductive line structure (e.g., the conductive line structure within the stitch-including integrated conductive line and via structure 92C) can be coplanar with a top surface of a dielectric material layer within the stack (e.g., the top surface of the first hard mask layer 41 or, if the first hard mask layer 41 is removed during the planarization step, the top surface of the third dielectric material layer 40). In one embodiment, a top surface of the underlying conductive line structure (e.g., a via-catching conductive line structure 26) can be coplanar with a top surface of a dielectric material layer within the stack (e.g., the top surface of the second dielectric material layer 20).

In one embodiment, a horizontal cross-sectional shape of the collateral via structure 99 can replicate the shape of the stitch shape in the design layout, and thus, can be a rectangle. See FIG. 1. A horizontal cross-sectional shape of the conductive line structure (e.g., the conductive line structure within the stitch-including integrated conductive line and via structure 92C) can replicate the shape of an Mx level design shape in the design layout, and thus, can be a polygon. See FIG. 1. In this case, a vertex of the rectangle can coincide with a vertex of the polygon.

Figure 13A:
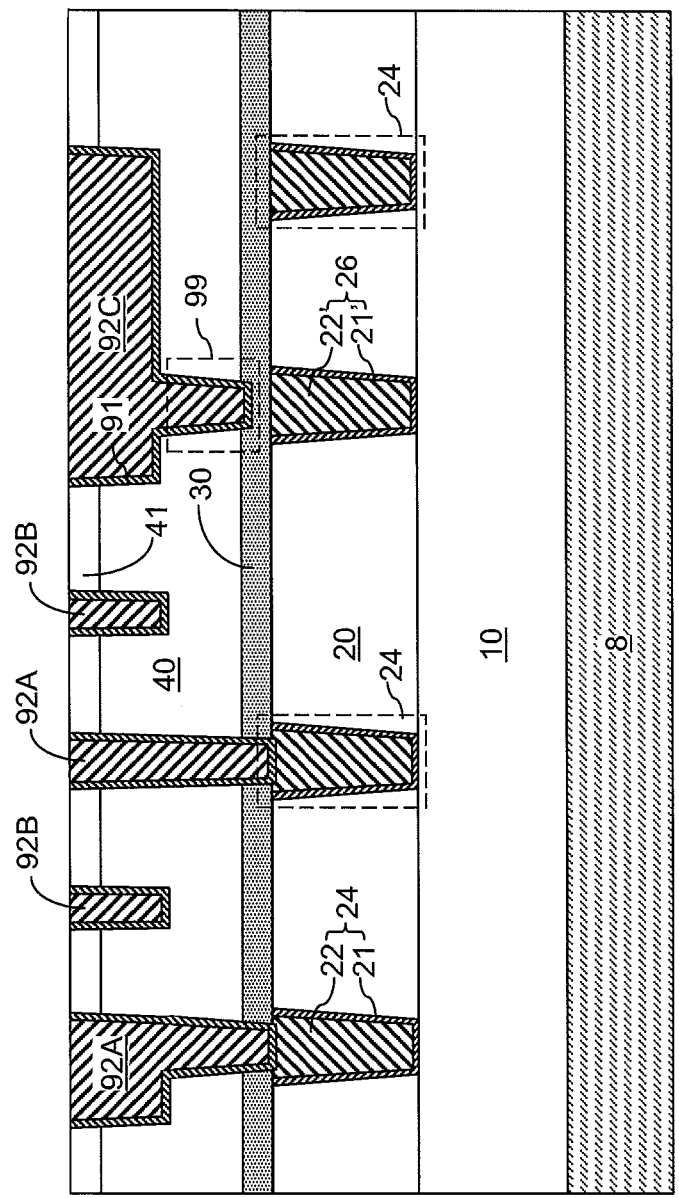
FIG. 13A is a vertical cross-sectional view of a variation of the first exemplary metal interconnect structure after formation of via structures and line structures in the interconnect level dielectric layer according to the first embodiment of the present disclosure.

Referring to FIG. 13A, a variation of the first exemplary semiconductor structure is shown. Process variations that cause reduction of the depth of the collateral via cavity 49 at the processing step of FIG. 11 can cause the collateral via cavity 49 not to reach the top surface of a via-catching conductive line structure 26 in the Mx level. Causes for reduction of the depth of the collateral via cavity 49 may be, for example, a variation in the third hard mask layer 43 or reductions in the etch rate during pattern transfer of the first pattern or the second pattern. In this case, the collateral via structure 99 may overlie a via-catching conductive via structure 26 such that the entire periphery of a bottom surface of the collateral via structure 99 is within an area enclosed by a periphery of the top surface of the via-catching conductive via structure 26, while the collateral via structure 99 does not contact the via-catching conductive via structure 26. In other words, the collateral via structure 99 overlies the via-catching conductive via structure 26 without contacting the via-catching conductive via structure 26. It is noted that a thinner third hard mask layer 43 or increases in the etch rate during pattern transfer of the first pattern or the second pattern does not result in protrusion of the collateral via cavity below the top surface of the via-catching conductive via structure 26 due to the presence of the via-catching conductive via structure 26 underneath the collateral via cavity 49 (See FIG. 11). Thus, formation of any collateral via cavity that extend below the top surface of Mx level structures (and may provide a narrow region in which a thin diffusion barrier liner might be formed) is prevented irrespective of variations in the thicknesses of the third hard mask layer 43 or variations in the etch rate during the pattern transfer of the first pattern or the second pattern.

Referring back to FIG. 1, the edges of the stitch shape are subsets of the edges of the polygons that define an M(x+1) level design shape. The edges of the polygon that defines the shape of the conductive line structure within the stitch-including integrated conductive line and via structure 92C are outer edges of a combination of a first type M(x+1) level design shape 140 and a second type M(x+1) level design shape 150. The first edge E1 of the polygon that adjoins a vertex of the polygon can be within a first vertical plane as a first edge F1 of the rectangle, and a second edge E2 of the polygon that adjoins the vertex of the polygon can be within a second vertical plane as a second edge F2 of the rectangle.

Figure 14:
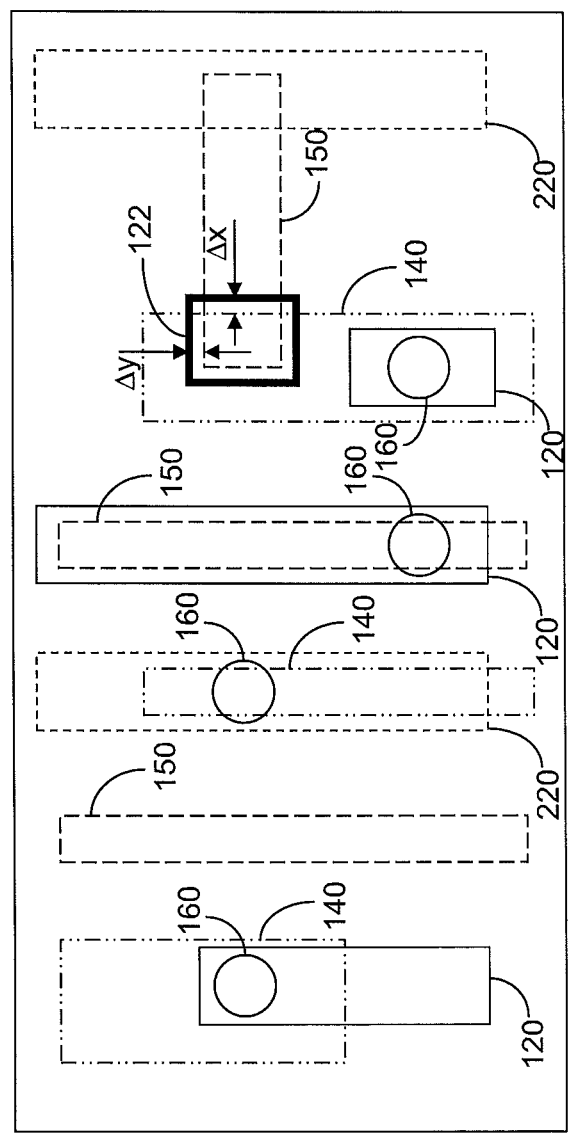
FIG. 14 is a plan view of a second exemplary design layout including a design shape in the underlying conductive line level for confining stitch-induced via structures according to a second embodiment of the present disclosure.

Referring to FIG. 14, a second exemplary design layout is shown, in which a plurality of underlying conductive line levels are provided. The plurality of underlying conductive line levels may include an upper underlying conductive line level and a lower underlying conductive line level. In one embodiment, the upper underlying conductive line level can be an Mx level, and the lower underlying conductive line level can be an M(x−1) level. In this case, the underlying-conductive-line-level design shapes can be Mx level design shapes 120 and M(x−1) level design shapes 220.

Figure 15:
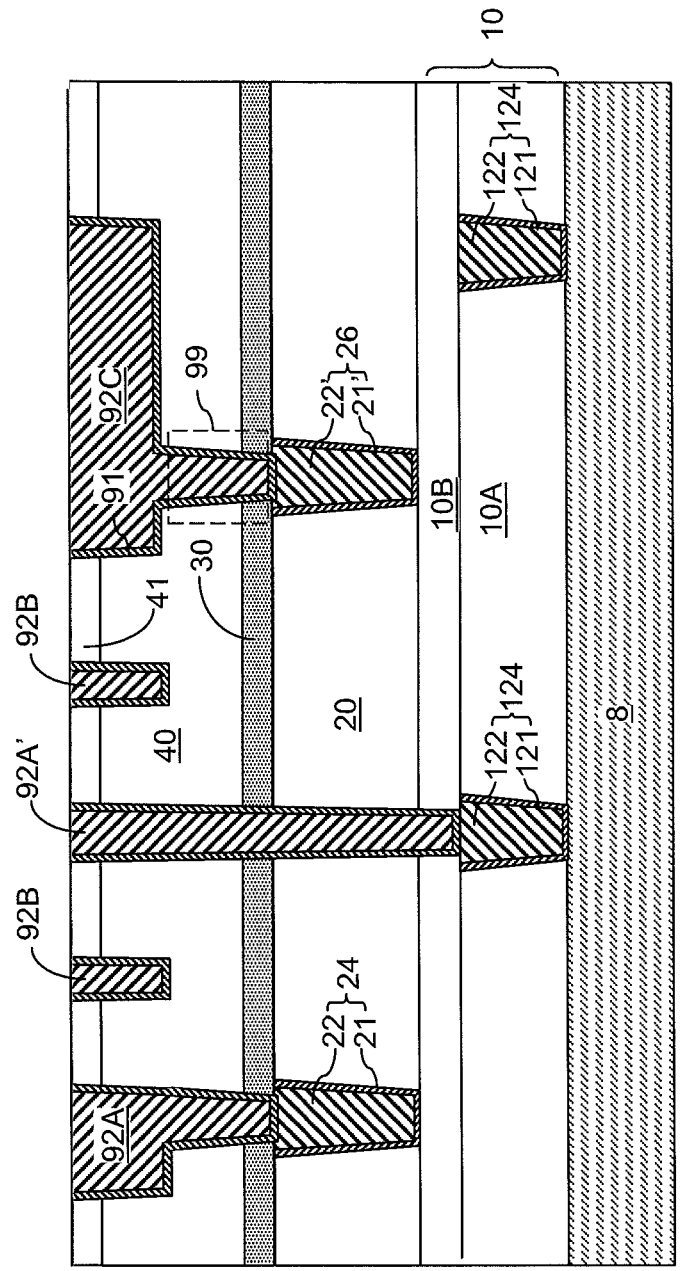
FIG. 15 is a vertical cross-sectional view of a second exemplary metal interconnect structure after formation of via structures and line structure in an interconnect level dielectric layer according to the second embodiment of the present disclosure.

Referring to FIG. 15, a second exemplary metal interconnect structure corresponding to the second exemplary design layout of FIG. 14 is shown after formation of via structures and line structure in an interconnect level dielectric layer, i.e., in the M(x+1) level. The first dielectric material layer 10 can be a stack of a lower first dielectric material layer 10A and an upper first dielectric material layer 10B.

The M(x+1) level corresponds to the conductive line level. The Mx level corresponds to the upper underlying conductive line level of the second embodiment. The M(x−1) level corresponds to the lower underlying conductive line level of the second embodiment.

M(x−1) level conductive line structures are embedded in the first dielectric material layer 10. An M(x+1) level conductive line structure 92B and integrated conductive line and via structures (92A, 92A', 92C) are embedded in the third dielectric material layer 40. A metallic liner 91 may be included in each of the M(x+1) level conductive line structure 92B and integrated conductive line and via structures (92A, 92A' 92C).

The integrated conductive line and via structures (92A, 92A', 92C) can include an interconnect integrated conductive line and via structure 92A' that provides electrical connections among components across the M(x+1) level and the M(x−1) level. Each via structure portion of an interconnect integrated conductive line and via structure 92A' corresponds to a via level design shape 160 that overlaps with an M(x−1) level design shape 220 in a design layout. The via structure of the interconnect integrated conductive line and via structure 92A vertically interconnects the conductive line structure of the interconnect integrated conductive line and via structure 92A' and an underlying conductive line structure, which is an interconnect conductive line structure 124 embedded in the M(x−1) level.

The M(x−1) level conductive line structures can include interconnect conductive line structures 124 that provide electrical connections among electrical components as known in the art. The interconnect conductive line structure 124 can include a metallic liner 121 and a metallic portion 122.

The second metal interconnect structure includes a stack of dielectric material layers (20, 30, 40, 41) embedding a conductive line structure (e.g., the conductive line structure within the stitch-including integrated conductive line and via structure 92C) in a conductive line level (e.g., the M(x+1) level, an underlying conductive line structure (e.g., a via-catching conductive line structure 26) located in an underlying conductive line level (i.e., the Mx level corresponding to the level of the second dielectric material layer 20) underneath the conductive line level (i.e., the M(x+1) level corresponding to the level of the third dielectric material layer 40 and the first hard mask layer 41 if any portion remains at this step), and a via structure (i.e., a collateral via structure 99) that vertically interconnect the conductive line structure and the underlying conductive line structure. At least one of the conductive line structure and the underlying line structure does not contact any conductive structure other than the collateral via structure 99.

In one embodiment, a top surface of the conductive line structure (e.g., the conductive line structure within the stitch-including integrated conductive line and via structure 92C) can be coplanar with a top surface of a dielectric material layer within the stack (e.g., the top surface of the first hard mask layer 41 or, if the first hard mask layer 41 is removed during the planarization step, the top surface of the third dielectric material layer 40). In one embodiment, a top surface of the underlying conductive line structure (e.g., a via-catching conductive line structure 26) can be coplanar with a top surface of a dielectric material layer within the stack (e.g., the top surface of the second dielectric material layer 20).

Figure 15A:
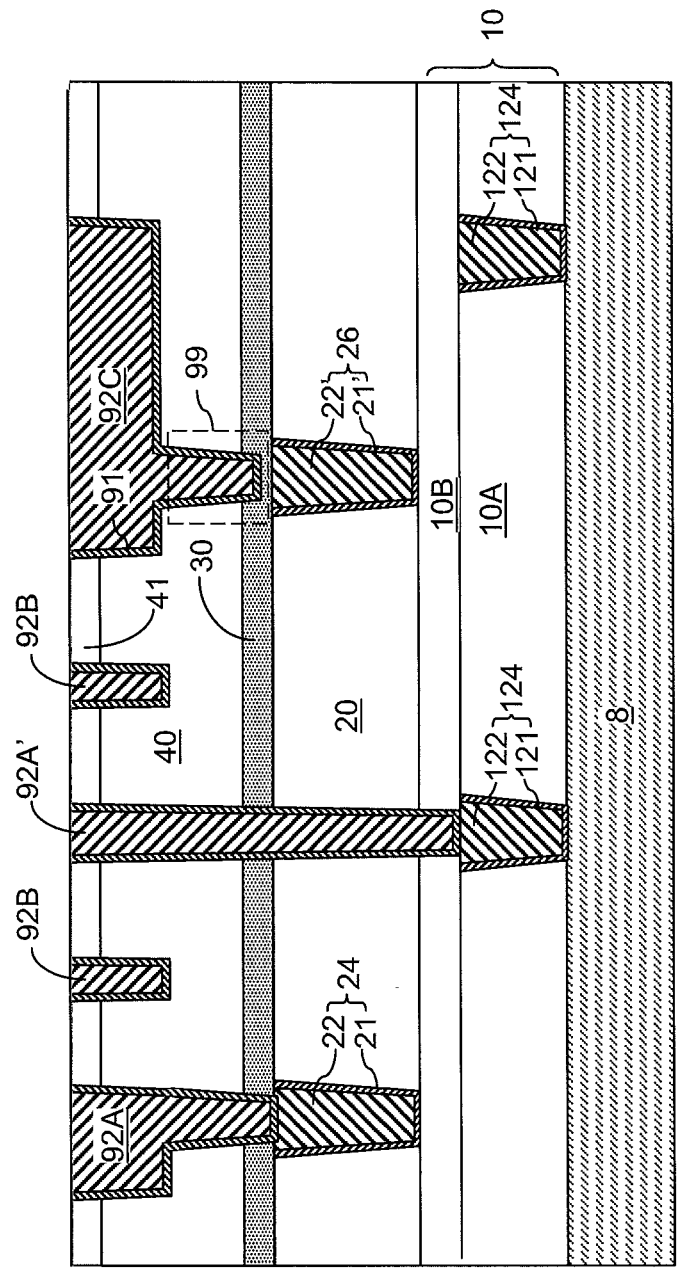
FIG. 15A is a vertical cross-sectional view of a variation of the third exemplary metal interconnect structure after formation of via structures and line structures in the interconnect level dielectric layer according to the first embodiment of the present disclosure.

Referring to FIG. 15A, a variation of the second exemplary semiconductor structure is shown. Process variations that cause reduction of the depth of the collateral via cavity 49 at the processing step of FIG. 11 can cause the collateral via cavity 49 not to reach the top surface of a via-catching conductive line structure 26 in the Mx level. Causes for reduction of the depth of the collateral via cavity 49 may be, for example, a variation in the third hard mask layer 43 or reductions in the etch rate during pattern transfer of the first pattern or the second pattern. In this case, the collateral via structure 99 may overlie a via-catching conductive via structure 26 such that the entire periphery of a bottom surface of the collateral via structure 99 is within an area enclosed by a periphery of the top surface of the via-catching conductive via structure 26, while the collateral via structure 99 does not contact the via-catching conductive via structure 26. In other words, the collateral via structure 99 overlies the via-catching conductive via structure 26 without contacting the via-catching conductive via structure 26. It is noted that a thinner third hard mask layer 43 or increases in the etch rate during pattern transfer of the first pattern or the second pattern does not result in protrusion of the collateral via cavity below the top surface of the via-catching conductive via structure 26 due to the presence of the via-catching conductive via structure 26 underneath the collateral via cavity 49 (See FIG. 11). Thus, formation of any collateral via cavity that extend below the top surface of Mx level structures (and may provide a narrow region in which a thin diffusion barrier liner might be formed) is prevented irrespective of variations in the thicknesses of the third hard mask layer 43 or variations in the etch rate during the pattern transfer of the first pattern or the second pattern.

Referring to FIG. 16, a third exemplary design layout is shown, in which a plurality of underlying conductive line levels are provided. The plurality of underlying conductive line levels may include an upper underlying conductive line level and a lower underlying conductive line level. In one embodiment, the upper underlying conductive line level can be an Mx level, and the lower underlying conductive line level can be an M(x−1) level. In this case, the underlying-conductive-line-level design shapes can be Mx level design shapes 120 and M(x−1) level design shapes 220.

Figure 17:
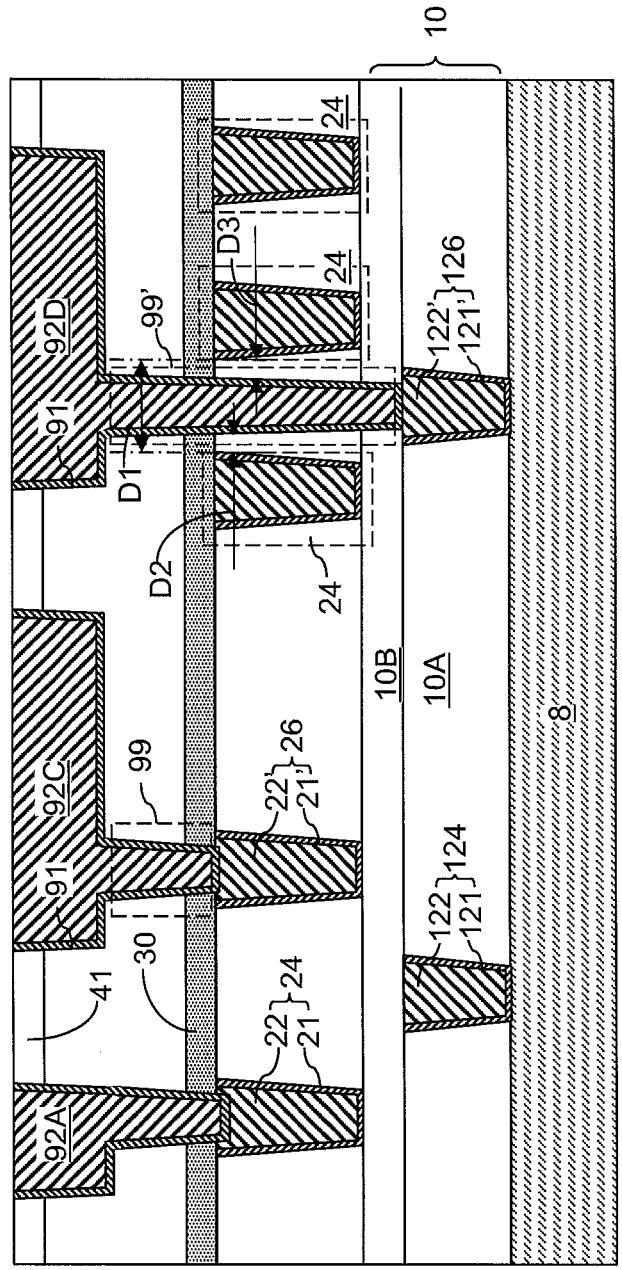
FIG. 17 is a vertical cross-sectional view of a third exemplary metal interconnect structure after formation of via structures and line structure in an interconnect level dielectric layer according to the third embodiment of the present disclosure.

Referring to FIG. 17, a third exemplary metal interconnect structure corresponding to the third exemplary design layout of FIG. 16 is shown after formation of via structures and line structure in an interconnect level dielectric layer, i.e., in the M(x+1) level.

The M(x+1) level corresponds to the conductive line level. The Mx level corresponds to the upper underlying conductive line level of the third embodiment. The M(x−1) level corresponds to the lower underlying conductive line level of the third embodiment.

M(x−1) level conductive line structures are embedded in the first dielectric material layer 10. An M(x+1) level conductive line structure 92B and integrated conductive line and via structures (92A, 92C, 92D) are embedded in the third dielectric material layer 40. A metallic liner 91 may be included in each of the M(x+1) level conductive line structure 92B and integrated conductive line and via structures (92A, 92C, 92D).

The M(x+1) level conductive line structure 92B is a line level structure that does not extend below the M(x+1) line level, i.e., does not have any via structure attached thereupon. The integrated conductive line and via structures (92A, 92C, 92D) can include an interconnect integrated conductive line and via structure 92A that provides electrical connections among components across the M(x+1) level and the Mx level as known in the art. Each via structure portion of an interconnect integrated conductive line and via structure 92A corresponds to a via level design shape 160 in a design layout that overlaps with an Mx level design shape 120.

The integrated conductive line and via structures (92A, 92C, 92D) can further include a stitch-including integrated conductive line and via structure 92C, which corresponds to an M(x+1) level design shape including a stitch that overlaps with an Mx level design shape in the design layout. The via structure that is a portion of the stitch-including integrated conductive line and via structure 92C is a collateral via structure 99, which does not have a corresponding via level design shape in the design layout, but is formed due to the stitch present in an M(x+1) level design shape that defines the line structure portion of the stitch-including integrated conductive line and via structure 92C. The collateral via structure 99 of the stitch-including integrated conductive line and via structure 92C vertically interconnects the conductive line structure of the stitch-including integrated conductive line and via structure 92C and an underlying conductive line structure, which is a via-catching conductive line structure 26 embedded in the Mx level of the first exemplary metal interconnect structure and corresponding to a stitch-surrounding design shape 122 in the Mx level of the first and second exemplary design layouts in FIGS. 1 and 14.

Further, the integrated conductive line and via structures (92A, 92C, 92D) can further include another stitch-including integrated conductive line and via structure 92D, which corresponds to an M(x+1) level design shape including a stitch that overlaps with an M(x−1) level design shape in the design layout. The via structure that is a portion of the stitch-including integrated conductive line and via structure 92D is a collateral via structure 99', which does not have a corresponding via level design shape in the design layout, but is formed due to the stitch present in an M(x+1) level design shape that defines the line structure portion of the stitch-including integrated conductive line and via structure 92D. The collateral via structure 99' of the stitch-including integrated conductive line and via structure 92D vertically interconnects the conductive line structure of the stitch-including integrated conductive line and via structure 92D and an underlying conductive line structure, which is a via-catching conductive line structure 126 embedded in the M(x−1) level of the third exemplary metal interconnect structure and corresponding to a stitch-surrounding design shape 222 in the M(x−1) level of the third exemplary design layout in FIG. 16.

The M(x−1) level conductive line structures (124, 126) can include an interconnect conductive line structure 124 that provide electrical connections among electrical components, and a via-catching conductive line structure 126. The via-catching conductive line structure 126 corresponds to the design shape in the lower underlying conductive line level (i.e., M(x−1) level) that occupies an entirety of an area of an overlapping stitch shape in the M(x+1) level in the design layout. The interconnect conductive line structure 124 can include a metallic liner 121 and a metallic portion 122. The via-catching conductive line structure 126 can include another metallic liner 121' and another metallic portion 122'.

The third metal interconnect structure includes a stack of dielectric material layers (10, 20, 30, 40, 41) embedding a conductive line structure (e.g., the conductive line structure within the stitch-including integrated conductive line and via structure 92C) in a conductive line level (e.g., the M(x+1) level, an underlying conductive line structure (e.g., a via-catching conductive line structure 126) located in an underlying conductive line level (i.e., the M(x−1) level corresponding to the level of the first dielectric material layer 10) underneath the conductive line level (i.e., the M(x+1) level corresponding to the level of the third dielectric material layer 40 and the first hard mask layer 41 if any portion remains at this step), and a via structure (i.e., a collateral via structure 99') that vertically interconnect the conductive line structure and the underlying conductive line structure. At least one of the conductive line structure and the underlying line structure does not contact any conductive structure other than the collateral via structure 99'.

In one embodiment, a top surface of the conductive line structure (e.g., the conductive line structure within the stitch-including integrated conductive line and via structure 92C) can be coplanar with a top surface of a dielectric material layer within the stack (e.g., the top surface of the first hard mask layer 41 or, if the first hard mask layer 41 is removed during the planarization step, the top surface of the third dielectric material layer 40). In one embodiment, a top surface of the underlying conductive line structure (e.g., a via-catching conductive line structure 126) can be coplanar with a top surface of a dielectric material layer within the stack (e.g., a top surface of the lower first dielectric material layer 10A). The Mx level conductive line structures (24, 26) are embedded in the second dielectric material layer 20.

In one embodiment, a spacing between neighboring interconnect conductive line structures 24 (such as a first distance D1) can be greater than the minimum spacing between neighboring design shapes according to design rules, and can be not less than a lithographic dimension that can be printed by a single lithographic exposure. However, a lateral distance between a collateral via structure 99' of a stitch-including integrated conductive line and via structure 92D and an interconnect conductive line structure 24 (such as a second distance D2 or a second distance D3 in FIG. 10) can be a sublithographic dimension. A nominal value for the second distance D2 or the third distance D3 can be any number greater than the overlay tolerance between the M(x+1) level and the Mx level. Once the overlay variation is added during the manufacturing process, the second distance D2 and the third distance may even be less than the overlay tolerance. Thus, an interconnect conductive line structure 24 in the Mx level can be laterally offset from the collateral via structure 99' by a lateral distance less than a lithographic dimension.

Figure 17A:
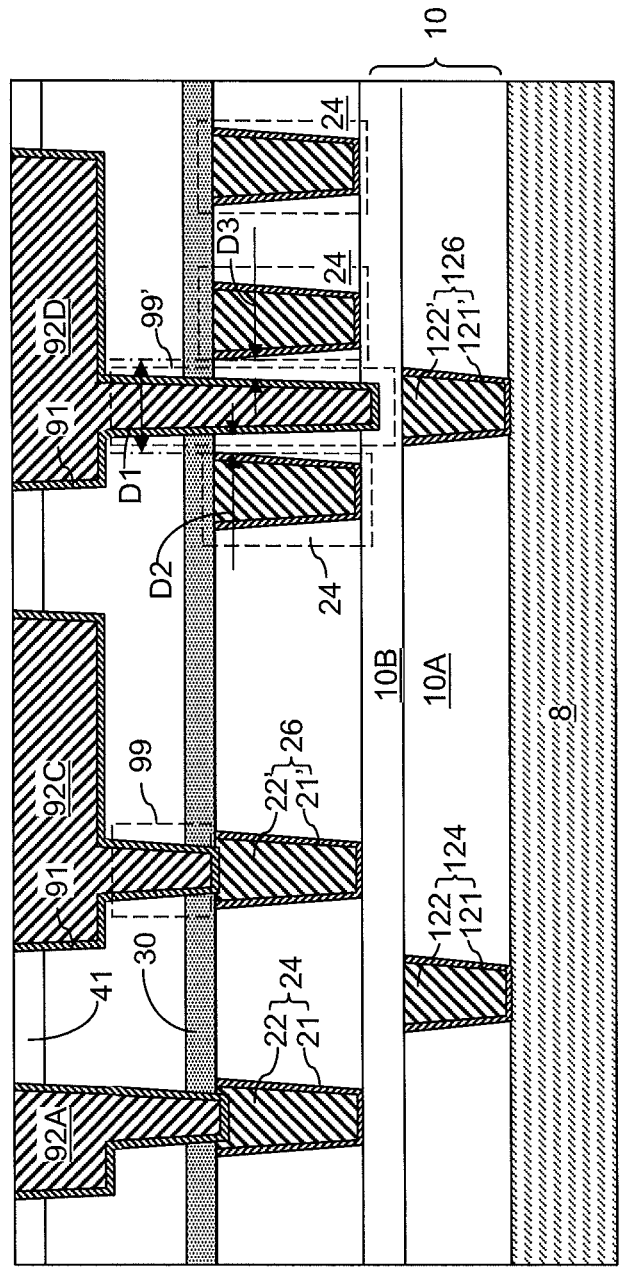
FIG. 17A is a vertical cross-sectional view of a variation of the third exemplary metal interconnect structure after formation of via structures and line structures in the interconnect level dielectric layer according to the first embodiment of the present disclosure.

Referring to FIG. 17A, a variation of the third exemplary semiconductor structure is shown. Process variations that cause reduction of the depth of the collateral via cavity in which the collateral via structure 99' is to be subsequently formed. In this case, the collateral via cavity and the collateral via structure 99' do not to reach the top surface of a via-catching conductive line structure 126 in the M(x-1) level. Causes for reduction of the depth of the collateral via cavity may be, for example, a variation in the third hard mask layer 43 (See FIG. 11) or reductions in the etch rate during pattern transfer of the first pattern or the second pattern. In this case, the collateral via structure 99' may overlie a via-catching conductive via structure 126 such that the entire periphery of a bottom surface of the collateral via structure 99' is within an area enclosed by a periphery of the top surface of the via-catching conductive via structure 126, while the collateral via structure 99' does not contact the via-catching conductive via structure 126. In other words, the collateral via structure 99' overlies the via-catching conductive via structure 126 without contacting the via-catching conductive via structure 126. It is noted that a thinner third hard mask layer 43 or increases in the etch rate during pattern transfer of the first pattern or the second pattern does not result in protrusion of the collateral via cavity below the top surface of the via-catching conductive via structure 126 due to the presence of the via-catching conductive via structure 126 underneath the collateral via cavity. Thus, formation of any collateral via cavity that extend below the top surface of M(x-1) level structures (and may provide a narrow region in which a thin diffusion barrier liner might be formed) is prevented irrespective of variations in the thicknesses of the third hard mask layer 43 (See FIG. 11) or variations in the etch rate during the pattern transfer of the first pattern or the second pattern.

The various modifications to the design layout according to the various embodiments enable reduction or elimination of collateral via structures that do not contact an underlying conductive line structure. Reduction or elimination of collateral via structures reduces the probability of electrical shorts and metallic contamination of interconnect structures, thereby improving yield of interconnect structures.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a metal interconnect structure, said method comprising:
    forming an underlying conductive line structure embedded in a dielectric material layer, wherein a top surface of said underlying conductive line structure is coplanar with a top surface of said dielectric material layer;
    forming another dielectric material layer over said dielectric material layer and said underlying conductive line structure; and
    forming a patterned hard mask layer over said another dielectric material layer, said patterned hard mask layer comprising a first pattern region in which a portion of a top surface of said patterned hard mask layer is recessed relative to a topmost surface of said patterned hard mask layer by a first recess depth, a second pattern region in which another portion of said top surface of said patterned hard mask layer is recessed relative to said topmost surface of said patterned hard mask layer by a second recess depth, and a third pattern region adjoining said first pattern region and said second pattern region that is recessed relative to said topmost surface of said patterned hard mask layer by a third recess depth that is greater than said first recess depth and is greater than said second recess depth, wherein an entirety of an area of said third pattern region is within an area of said underlying conductive line structure in a see-through top-down view along a direction perpendicular to said topmost surface of said patterned hard mask layer.

2. The method of claim 1, further comprising transferring a pattern in said patterned hard mask layer into said another dielectric material layer by an anisotropic etch, wherein line trenches are formed in said first and second pattern regions in said another dielectric material layer, and a via cavity is formed in said third pattern region.

3. The method of claim 2, wherein said via cavity extends to a top surface of said underlying conductive line structure, and a bottommost surface of said line trenches is located above said top surface of said dielectric material layer.

4. The method of claim 3, further comprising forming a contiguous conductive structure filling said via cavity and one of said line trenches.

5. The method of claim 4, wherein said contiguous conductive structure comprises a conductive line structure and a via structure, wherein said via structure contacts said conductive line structure and contacts, or overlies without contacting, said underlying conductive line structure.

6. The method of claim 5, wherein at least one of said conductive line structure and said underlying line structure does not contact any conductive structure other than said via structure.

7. The method of claim 6, wherein said conductive line structure does not contact any conductive structure other than said via structure.

8. The method of claim 6, wherein said underlying conductive line structure does not contact any conductive structure other than said via structure.

9. The method of claim 6, wherein said conductive line structure and said underlying conductive line structure do not contact any conductive structure other than said via structure.

10. The method of claim 6, further comprising forming yet another conductive line structure embedded in yet another dielectric material layer above said dielectric material layer, wherein said another dielectric material layer is formed above said yet another dielectric material layer.

\* \* \* \* \*